(12) United States Patent
Ito et al.

(10) Patent No.: US 6,407,367 B1
(45) Date of Patent: Jun. 18, 2002

(54) HEAT TREATMENT APPARATUS, HEAT TREATMENT PROCESS EMPLOYING THE SAME, AND PROCESS FOR PRODUCING SEMICONDUCTOR ARTICLE

(75) Inventors: Masataka Ito, Chigasaki; Nobuhiko Sato, Sagamihara, both of (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/217,136

(22) Filed: Dec. 21, 1998

(30) Foreign Application Priority Data

Dec. 26, 1997 (JP) .............................. 9-361087

(51) Int. Cl.$^7$ ................................. F27B 5/14
(52) U.S. Cl. ................ 219/390; 392/416; 219/405; 373/136; 118/724; 427/553; 432/77
(58) Field of Search ................. 219/390, 405, 219/411; 392/416, 418; 118/724, 725, 728, 730, 50.1; 373/136; 427/553, 557, 559; 432/77, 83, 152; 438/795

(56) References Cited

U.S. PATENT DOCUMENTS 5,225,378 A * 7/1993 Ushikawa .................. 437/233
5,567,152 A * 10/1996 Morimoto .................. 432/241

FOREIGN PATENT DOCUMENTS

| GB | 2184885 | * | 7/1987 |
|----|---------|---|--------|
| JP | 5-152309 |  | 6/1993 |
| JP | 5-217821 |  | 8/1993 |
| JP | 5-218053 |  | 8/1993 |
| JP | 7-161655 |  | 6/1995 |
| JP | 7-193074 |  | 7/1995 |
| JP | 7-302767 |  | 11/1995 |
| JP | 08-31761 |  | 2/1996 |
| JP | 08-316160 | * | 11/1996 |

OTHER PUBLICATIONS

Derwent Abstract Accession No. 97–251211/23, JP 09–082646, Mar. 28, 1997.
Derwent Abstract Accession No. 97–070617/07, JP 08–316160, Nov. 29, 1996.
Derwent Abstract Accession No. 96–405068/41, JP 07–099163, Apr. 11, 1995.
Derwent Abstract Accession No. 95–297159/39, JP 07–193074, Jul. 28, 1995.
Derwent Abstract Accession No. 97–518746/48, JP 09–245957, Sep. 19, 1997.

* cited by examiner

*Primary Examiner*—Teresa Walberg
*Assistant Examiner*—Shawntina Fuqua
(74) *Attorney, Agent, or Firm*—Fitzpatrick, Cella, Harper & Scinto

(57) ABSTRACT

A novel heat treatment apparatus is provided which comprises a first tube, a second tube placed therein, and a heater. A semiconductor article is heat treated in the second tube in an atmospheric gas. At least an internal face of the second tube is constructed from non-silicon oxide, and the first tube is constructed from vitreous silica. In this way, hydrogen gas is fed to a wafer without passing over a face comprised of silicon oxide heated to a high temperature. This apparatus prevents metal contamination of the wafer by fused quartz tube as the contamination source and also prevents etching of silicon by reaction of silicon oxide and silicon.

73 Claims, 13 Drawing Sheets

FIG. 8A S31 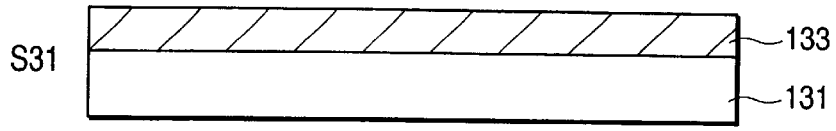
FIG. 8B S32 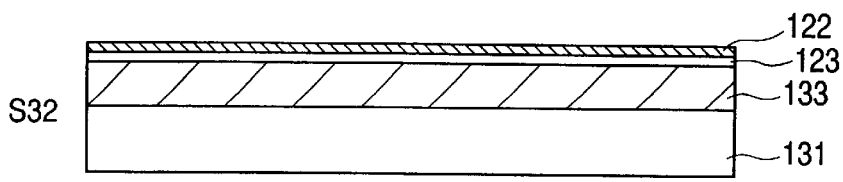
FIG. 8C S33 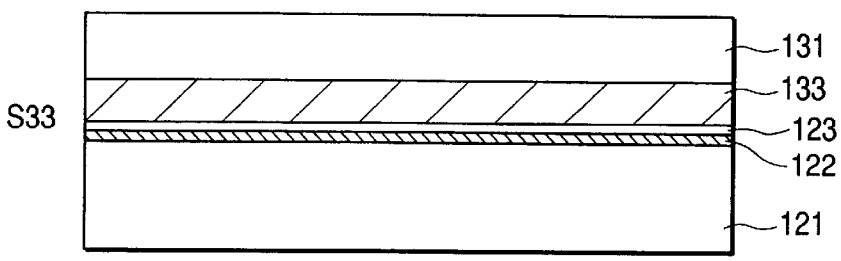
FIG. 8D S34 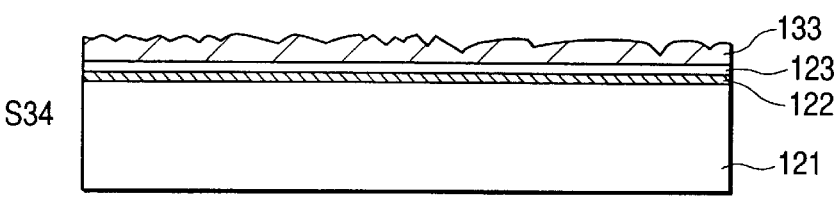
FIG. 8E S35 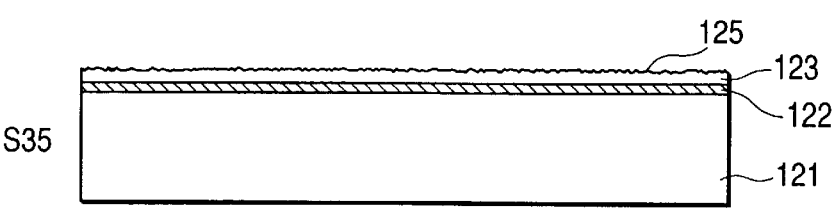
FIG. 8F S36 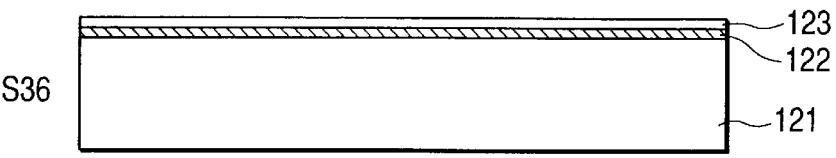

HEAT TREATMENT APPARATUS, HEAT TREATMENT PROCESS EMPLOYING THE SAME, AND PROCESS FOR PRODUCING SEMICONDUCTOR ARTICLE

BACKGROUND OF THE INVENTION

1. Field of the Invention

The present invention relates to a heat treatment apparatus and a heat treatment method for heat treating a semiconductor article in the production of a semiconductor device for integrated circuits. The present invention also relates to a process for producing a semiconductor article.

2. Related Background Art

In the production of a semiconductor device, a heat treatment apparatus is used in a process of forming an oxide film or diffusing an impurity as a donor or an acceptor and in a process of annealing a semiconductor article such as a bulk Si wafer in a hydrogen-containing reducing atmosphere.

FIG. 9 shows a first example of a heat treatment apparatus of the prior art. This heat treatment apparatus has inner tube 1 and outer tube 2. A hydrogen-containing reducing gas $G_H$ is introduced from inlet 5 and is discharged through vent 6. Into the interspace between inner tube 1 and outer tube 2, an oxygen-containing gas $G_o$ is introduced through inlet 7 and is discharged through vent 8 to prevent penetration of copper (Cu) from the outside into inner tube 1. The symbol W indicates an Si wafer. The numeral 4 indicates a boat. Such an apparatus is disclosed in Japanese Patent Application Laid-Open No. 5-152309.

FIG. 10 shows a second example of a heat treatment apparatus of the prior art. This heat treatment apparatus comprises inner tube 1 made of silicon carbide (SiC), heater 3, and therebetween an open-ended outer tube 2 made of fused quartz produced by an oxyhydrogen flame fusion method and containing OH groups at a content of 200 ppm. The outer tube prevents diffusion of metal impurity. Such an apparatus is disclosed in Japanese Patent Application Laid-Open No. 7-193074.

FIG. 11 shows a third example of a heat treatment apparatus of the prior art. This heat treatment apparatus comprises inner tube 1 made of SiC and outer tube 2 made of fused quartz. An oxygen-containing purge gas is introduced into the interspace between inner tube 1 and outer tube 2 through inlet pipe 7 and is discharged through vent pipe 8. A cooling gas is introduced through inlet pipe 10 and is discharged through vent pipe 11. The numeral 9 indicates a table which serves as a heat barrier. Such an apparatus is disclosed in Japanese Patent Application Laid-Open No. 8-31761.

FIG. 12 shows a fourth example of a heat treatment apparatus of the prior art. This heat treatment apparatus comprises inner tube 1 and outer tube 2, both made of fused quartz, and heat equalizer tube 20 between outer tube 2 and heater 3. An oxygen-containing gas is introduced from gas inlet pipe 12 at the bottom to the interspace between inner tube 1 and outer tube 2, further introduced to the inside of inner tube 1 through plural gas inlet holes 5, and discharged from vent pipe 6. The numeral 13 indicates a heat insulating material. Such an apparatus is disclosed in Japanese Patent Application Laid-Open No. 7-161655.

FIG. 13 shows a fifth example of a heat treatment apparatus of the prior art. This apparatus comprises inner tube 1 made of SiC and outer tube 2 made of fused quartz. A treating gas like an oxidizing gas is introduced from inlet 5 at the bottom into inner tube 1, further introduced through communication hole 13 into the interspace between inner tube 1 and outer tube 2, and discharged from vent 6. Such an apparatus is disclosed in Japanese Patent Application Laid-Open No. 7-302767.

However, the apparatuses of the prior art have problems of contamination, treating gas leakage, reaction tube deformation, reaction tube cracking, and so forth, which have not been solved.

On the other hand, it was found by the inventors of the present invention that by conducting heat treatment in a hydrogen-containing reducing atmosphere, semiconductor articles are etched undesirably.

SUMMARY OF THE INVENTION

An object of the present invention is to provide a heat treatment apparatus, a heat treatment method, and a production process for semiconductor articles in which the metal contamination caused by the metal of a reaction tube is reduced.

Another object of the present invention is to provide a heat treatment apparatus, a heat treatment method, and a production process for semiconductor articles in which gas leakage caused by reaction tube deformation is prevented.

A further object of the present invention is to provide a heat treatment apparatus, a heat treatment method, and a production process for semiconductor articles in which undesired etching is prevented.

According to an aspect of the present invention, there is provided a heat treatment apparatus which comprises a first tube, a second tube placed therein, and a heater. The first tube can be tightly closed and is made of vitreous silica having an impact strength higher than that of the second tube. The second tube has at least an internal face comprised of non-silicon oxide, and a gas flow path is constructed to introduce a gas into a treatment space in the second tube without passing over a face comprised of silicon oxide heated to a high temperature by the heater.

According to another aspect of the present invention, there is provided a heat treatment apparatus comprising a first tube, a second tube placed therein, and a heater. A gas inlet for introducing the gas in the second tube is provided below the heater, a hole for communicating the first tube to the second tube is provided at a top portion of the second tube, a vent is provided at a bottom portion of the first tube for discharging the gas from inside of the first tube, the first tube is constructed from fused quartz and is able to be closed, the second tube has a non-silicon oxide surface and is able to be closed, and the heater is provided at higher level than a heat barrier placed in the second tube.

According to another aspect of the present invention, there is provided a heat treatment process for heat treating a semiconductor article by means of the heat treatment apparatuses set forth above.

According to a further aspect of the present invention, there is provided a process for producing a semiconductor article, the process comprising bonding a first base plate and a second base plate, eliminating an unnecessary portion of the first base member from the second base member, and heat treating a silicon body on the second base member in a hydrogen-containing reducing atmosphere by means of the above-mentioned treatment apparatuses set forth in above.

BRIEF DESCRIPTION OF THE DRAWINGS

FIGS. 8A, 8B, 8C, 8D, 8E and 8F show schematically an embodiment of the process for producing a semiconductor article according to the present invention.

DESCRIPTION OF THE PREFERRED EMBODIMENTS

Figure 1:
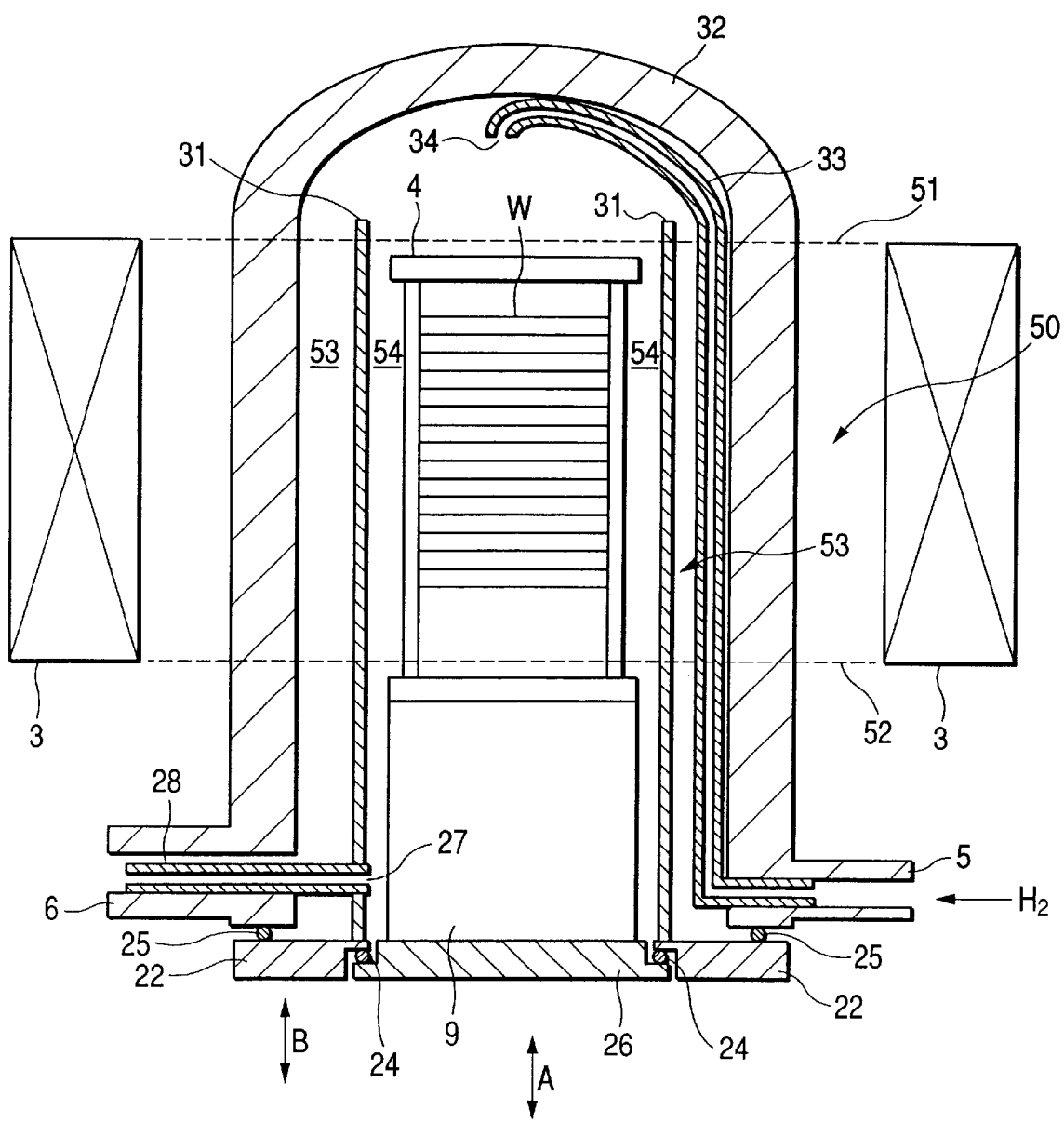
FIG. 1 is a sectional view of an example of a heat treatment apparatus of the present invention.

FIG. 1 shows an embodiment of the heat treatment apparatus of the present invention. The heat treatment apparatus has inner tube (second tube) 31, furnace tube (first tube) 32, and hydrogen-containing gas introduction pipe 33. Inner tube 31 has at least an inside wall comprised of a non-silicon oxide such as silicon carbide, silicon nitride, boron nitride, aluminum oxide, etc. Furnace tube 32 is made of impact resistant vitreous silica such as fused quartz. Gas introduction pipe 33 has an inner face comprised of non-silicon oxide similar to inner tube 31. Heater 3 is placed with the top end at level 51 and the bottom end at level 52 to heat region 50 to a prescribed temperature.

The hydrogen-containing gas is introduced from inlet 5 into the apparatus, released from outlet 34 to treatment region (treatment space) 54, and discharged through vent 6 at the bottom of the apparatus to the outside. Even if a metallic impurity is emitted from heater 3 or furnace tube 32, the impurity is blocked by inner tube 31 having an inside wall of non-silicon oxide so as not to reach semiconductor article W. Gas introduction pipe 33 has also an inside wall of non-silicon oxide to prevent emission of metallic impurity into the hydrogen-containing gas in the gas introduction pipe. Metallic impurity may penetrate into region 53, but it will be driven out from vent 6.

Furnace tube 32 which is made of fused quartz has an impact strength higher than inner tube 31, deforms less, and is difficult to crack. The impact strength may be thermal impact strength and/or mechanical impact strength. Treatment region 54 is enclosed by inner tube 31 made of heat insulating fused quartz.

The hydrogen-containing gas is introduced into treatment space 54 in inner tube 31 without passing over a heated silicon oxide face (e.g., region 53) heated by heater 3 to a high temperature.

The numeral 22 indicates a mount of inner tube 31, the numerals 24 and 25 indicate a sealing member such as an O-ring, the numeral 27 indicates a vent of inner tube 31, and the numeral 26 indicates a furnace cover.

In the process of heat treatment of a semiconductor article in a hydrogen-containing atmosphere (hydrogen annealing), etching was found to occur by the inventors of the present invention. This etching is described below.

The detail of the hydrogen annealing is shown, for example, in Japanese Patent Application Laid-Open Nos. 5-218053, and 5-217821 and in N.Sato and T.Yonehara Appl. Phys. Lett., vol. 65, p. 1924 (1994).

Figure 2:
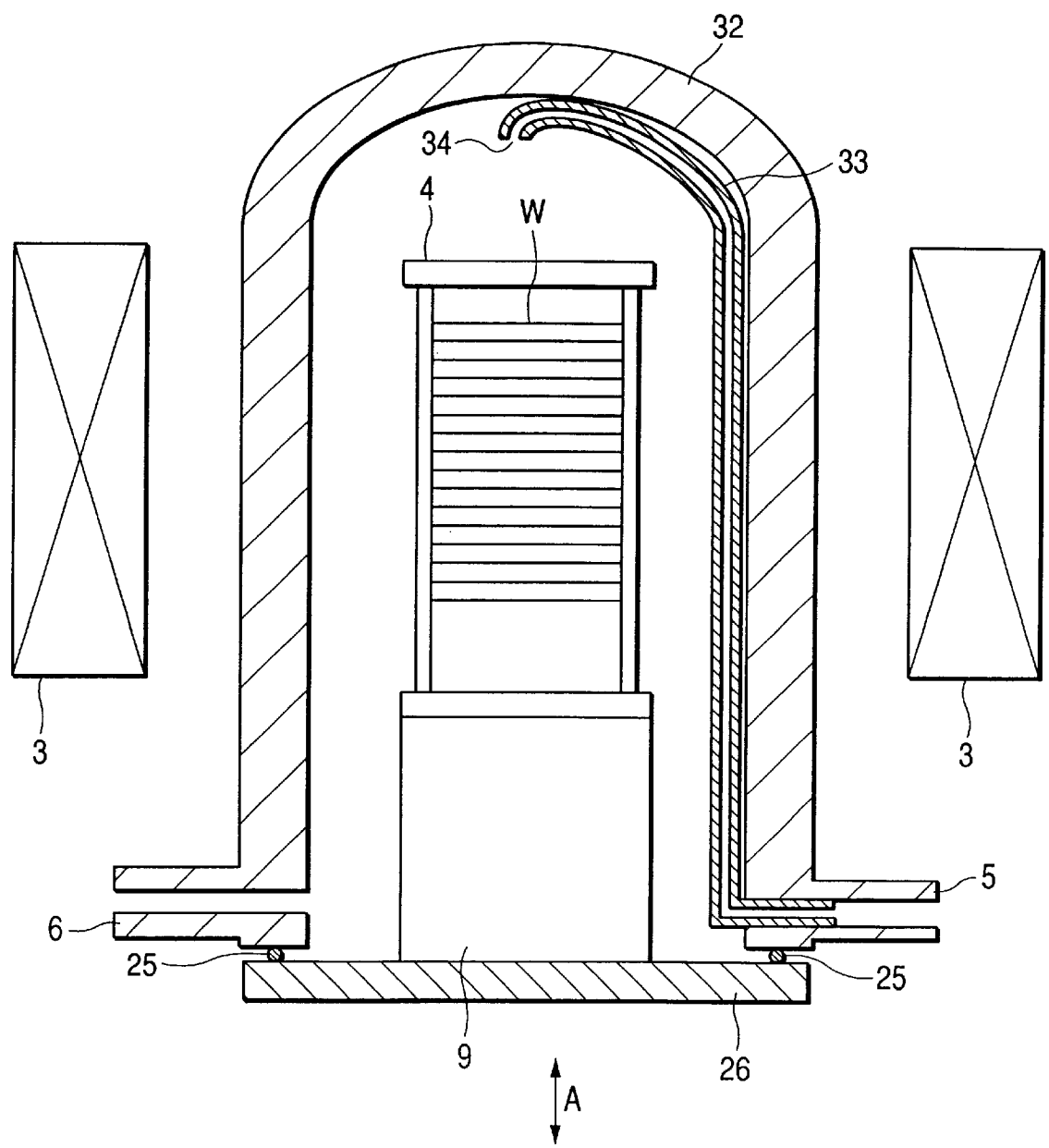
FIG. 2 is a sectional view of a heat treatment apparatus.

First, the inventors of the present invention annealed a substrate of SOI (semiconductor on insulator) in a hydrogen atmosphere with the apparatus shown in FIG. 2.

In FIG. 2, furnace tube 32 is formed from fused quartz having high heat resistance and high workability. In furnace tube 32, there are placed SOI wafer W to be heat treated, boat 4 for holding wafer W, and heat barrier 9 for supporting boat 4. Boat 4 is made of a heat-resistant material such as silicon carbide having on the surface an extremely pure SiC coating layer formed by CVD (chemical vapor deposition). Heat barrier 9 is formed from a heat-insulating material such as foamed quartz. Furnace cover 26 seals the opening of furnace tube 32 to be gastight with O-ring 25 and is movable in the direction of arrow A by a boat elevator mechanism (not shown in the drawing). Heater 3 heats wafer W by electric current application.

In this apparatus, the treatment gas is introduced from gas inlet 5 through gas introduction pipe 33 to the top and interior of furnace tube 32. The introduced gas flows in the interior of furnace tube 32 downward and is discharged through vent 6. The gas inlet 5, gas introduction pipe 33, and vent 6 are usually formed from fused quartz. Setting of wafer W on boat 4 is conducted by lowering furnace cover 26 to such a position that boat 4 is brought out of furnace 32. After setting the wafer, furnace cover 26 is elevated to insert boat 4 into furnace tube 32 and to close the opening of the furnace tube to be gastight by use of O-ring 25 as shown in FIG. 2. Thereby, the hydrogen gas can be used safely.

The hydrogen annealing is conducted by introducing a hydrogen gas as the treating gas through gas inlet 5 to replace the internal atmosphere in furnace tube 32 to obtain a hydrogen-containing reducing atmosphere and applying electric current to a heating resistor of heater 3 to heat wafer W on boat 4 to a prescribed temperature (e.g., 1200° C. ). After a prescribed time (e.g., one hour), the electric current to the heating resistor is stopped, wafer W is cooled by heat radiation to a prescribed temperature, and simultaneously an inert gas such as nitrogen gas is introduced from gas inlet 5 to replace the hydrogen gas in the furnace tube 32. Then furnace cover 26 is lowered, and wafer W on boat 4 is taken out from furnace tube 32. In such a manner, an SOI substrate is heat treated in a hydrogen-containing reducing gas atmosphere to flatten and smooth the surface of the semiconductor body on the substrate.

In the annealing, the thickness of the Si body on the SOI substrate was found to decrease. This is caused by the reaction below. During the hydrogen annealing, the hydrogen gas and the fused quartz reacts to form water.

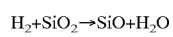

$$H_2 + SiO_2 \rightarrow SiO + H_2O$$

The formed water, when it reaches the wafer W, reacts with silicon of wafer W to cause etching of silicon.

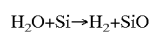

$$H_2O + Si \rightarrow H_2 + SiO$$

In the treatment of the SOI substrate, this etching decreases the thickness of the single crystal silicon layer (SOI layer) on an insulator and simultaneously causes variation of layer thickness. The variation of the SOI layer thickness deteriorates the properties of the formed electronic device, in particular, of a full depletion type of FET (field effect transistor).

For preventing the etching of silicon, use of silicon carbide which is not reactive to hydrogen gas at a temperature higher than 900° C. is effective in place of the fused quartz for the material of furnace tube 32. However, the silicon carbide is brittle to mechanical impact and/or thermal impact, and a silicon carbide furnace tube may cause cracking. Accordingly, the construction and the material of the gas introduction path and the heater should be investigated.

The fused quartz used for constructing furnace tube 32 contains a metal impurity (e.g., iron) in an amount ranging from about 10 ppm to about 100 ppm by weight. In hydrogen annealing at a temperature of 1000° C. or higher, this impurity is released from the fused quartz into the hydrogen gas and is deposited on the surface of wafer W to thereby contaminate it. This metal contamination may shorten the minority carrier lifetime of wafer W and can deteriorate the performance of the electronic device provided on wafer W.

In one possible method for the prevention of metal contamination, the fused quartz for furnace tube 32 is replaced by silicon carbide which has on the surface a coating layer of extremely pure silicon carbide formed by CVD. However, the silicon carbide which is brittle against mechanical impact and/or thermal impact may crack and therefore leak the hydrogen gas.

In another method, the fuzed quartz for furnace tube 32 is replaced by synthetic fused silica which is formed by a direct method. In contrast to the fused quartz produced from a natural mineral resource, the synthetic fused silica is synthesized chemically from $SiCl_4$ by direct deposition vitrification by oxyhydrogen flame hydrolysis and contains metal impurity at an extremely low content of 1 ppm by weight or less. However, the synthetic fused silica by a direct method is less heat-resistant than fused quartz. Therefore, furnace tube 32, which is formed from synthetic fused silica, may cause gas leakage by deformation at a high temperature.

The heat treatment apparatus shown in FIG. 2, as described above, exhibits disadvantageous metal contamination of wafer W upon hydrogen annealing treatment. Furthermore, the apparatus and the method of FIG. 2 exhibits disadvantageous etching of silicon by moisture formed by the reaction of the hydrogen gas and the fused silica.

Figure 9:
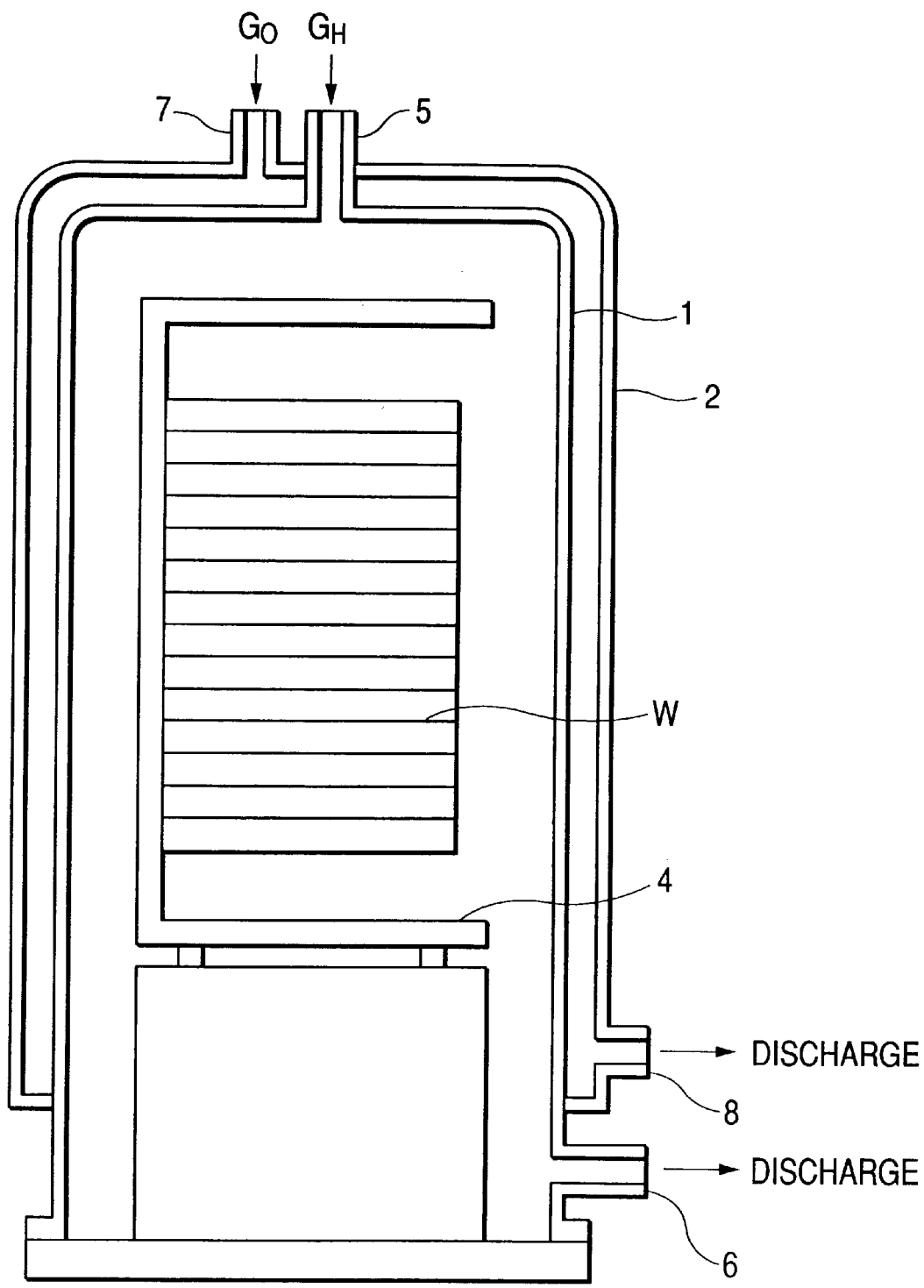
FIG. 9 is a sectional view of a first example of conventional heat treatment apparatuses.
Figure 10:
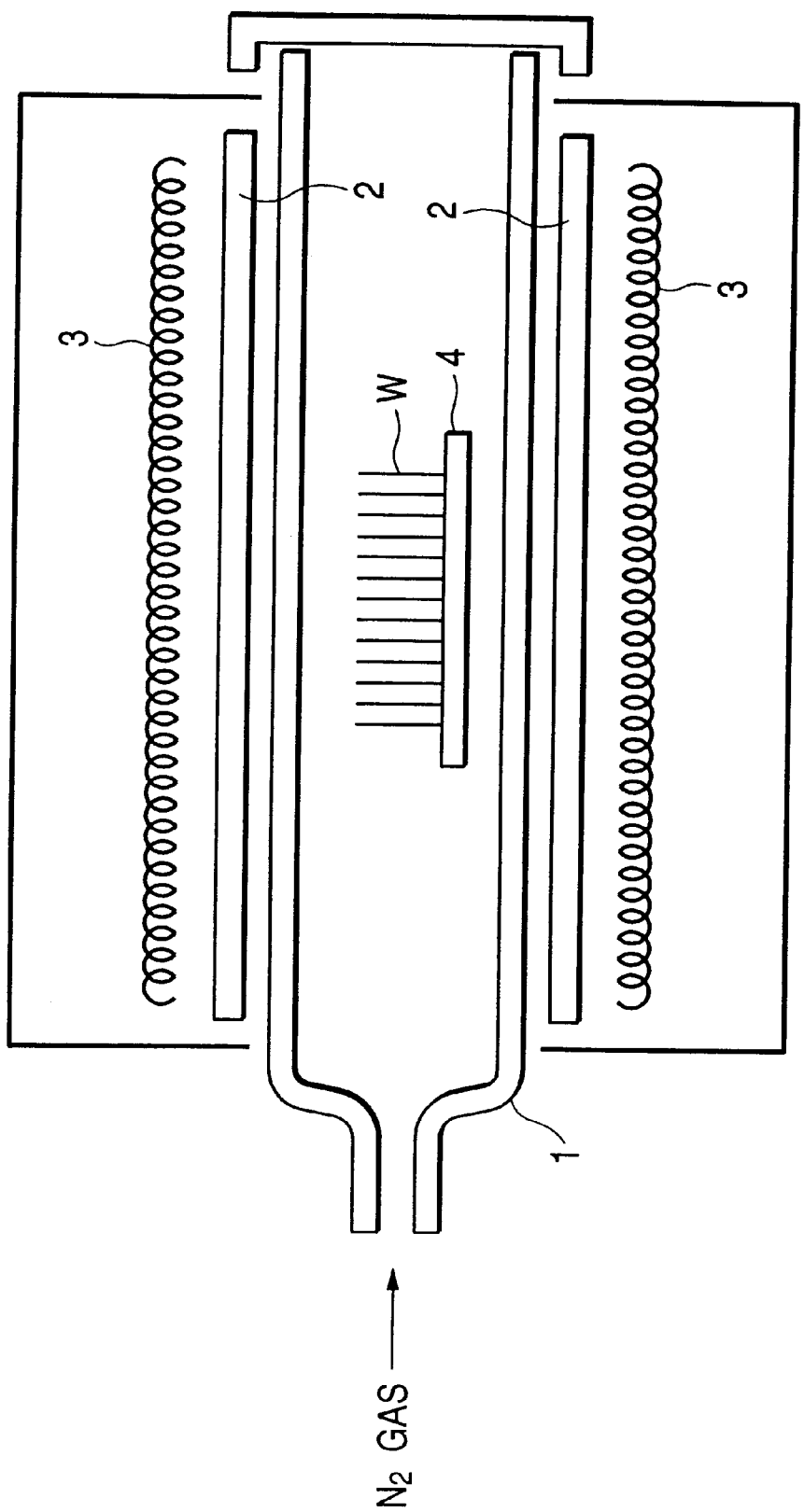
FIG. 10 is a sectional view of a second example of conventional heat treatment apparatuses.
Figure 11:
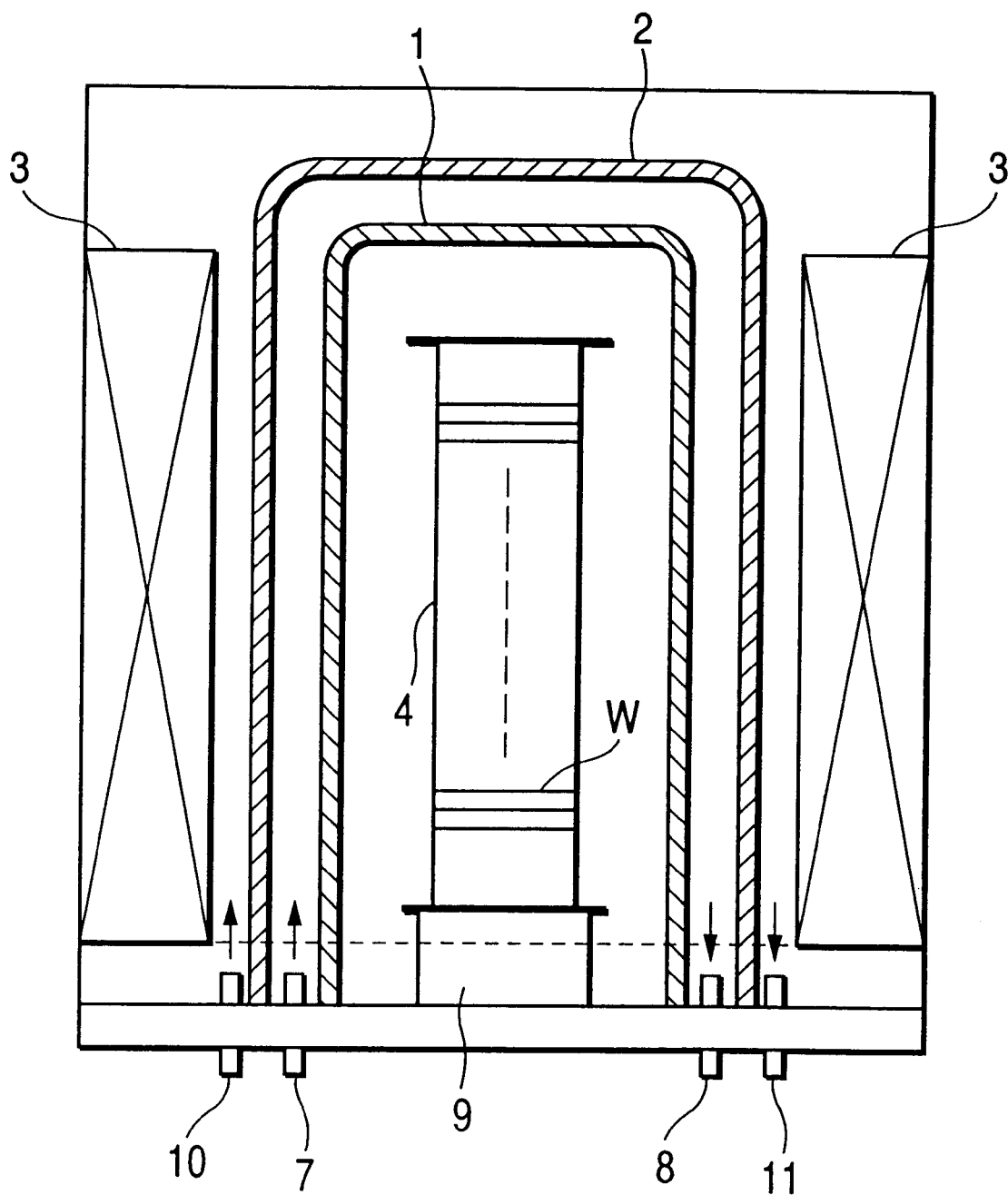
FIG. 11 is a sectional view of a third example of conventional heat treatment apparatuses.
Figure 12:
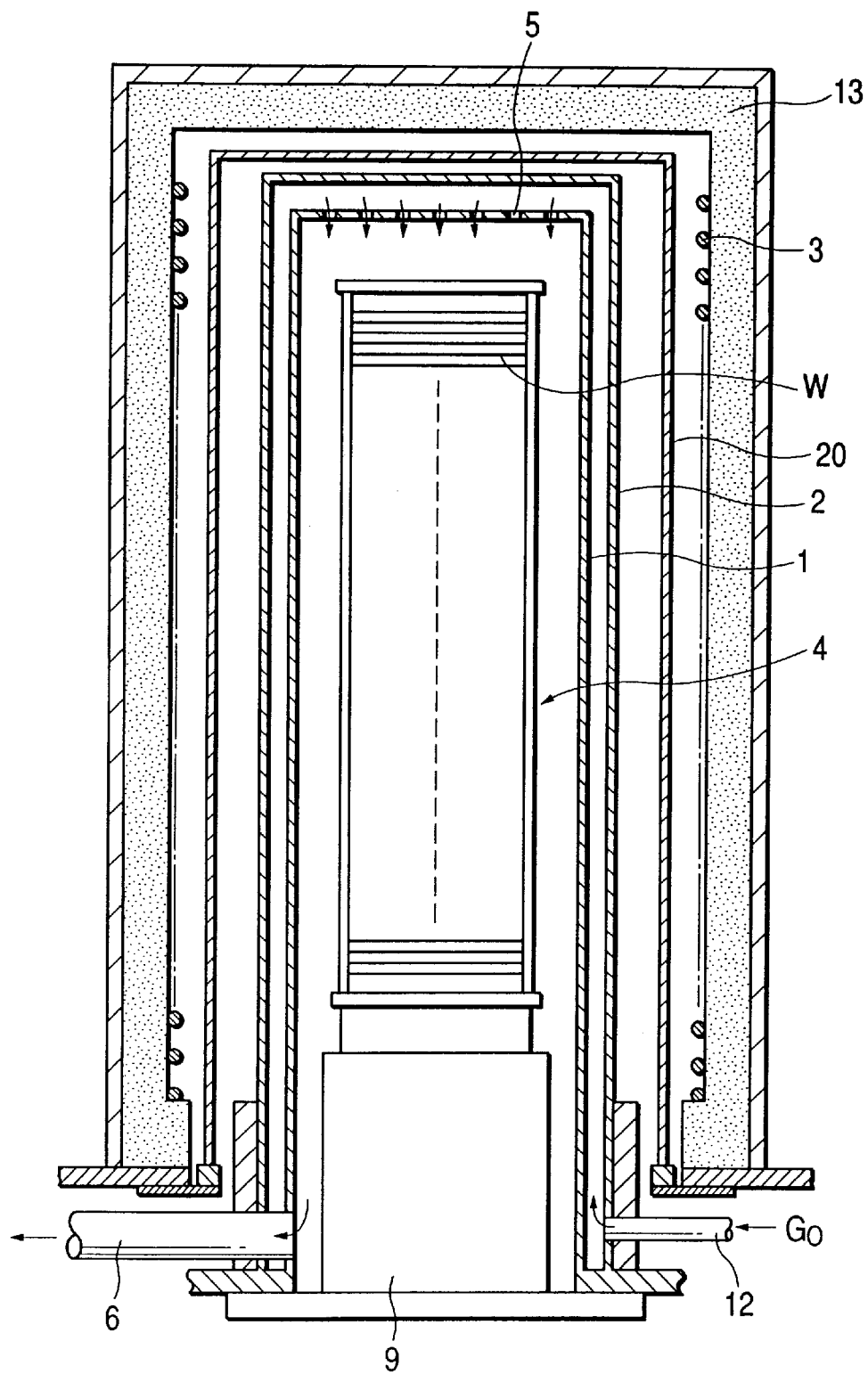
FIG. 12 is a sectional view of a fourth example of conventional heat treatment apparatuses.
Figure 13:
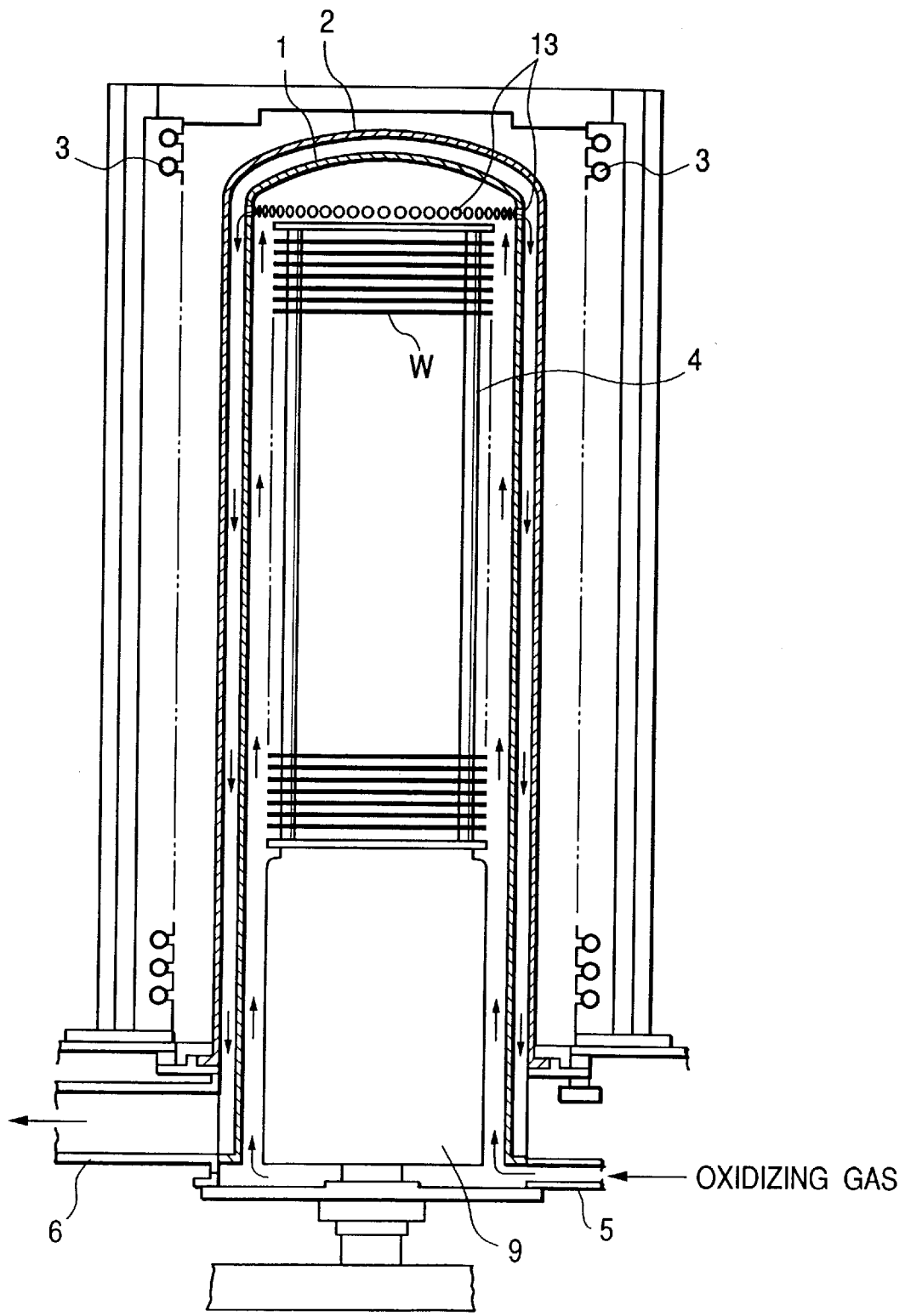
FIG. 13 is a sectional view of a fifth example of conventional heat treatment apparatuses.

Similarly, in the example shown in FIG. 9, the etching occurs due to the absence of an inside liner of non-silicon oxide. In the example shown in FIG. 10, gas leakage is liable to occur since the treatment space is closed by a single tube of SiC. In the example shown in FIG. 11, moisture is developed from table 9 since the top of table 9 made of vitreous silica is heated by heater 3. In the example shown in FIG. 12, etching occurs similarly upon hydrogen annealing. In the example shown in FIG. 13 also, water is formed on the top of table 9 constituted of vitreous silica and the gas absorbs the moisture and is fed to wafer W to cause etching upon hydrogen annealing.

The present invention solves the problems involved in the conventional apparatuses.

Embodiment 1

A first embodiment of the present invention is described by reference to FIG. 1.

In this embodiment, furnace tube 32, gas inlet 5, and vent 6 are formed from fused quartz in one body. The boat 4 for holding wafer W is made of silicon carbide, and thereon a coating layer of extremely pure SiC is formed by CVD. Heat barrier 9 is made of heat-insulating foamed silica (porous silicon oxide) and is not heated to a temperature of 1000° C. or higher.

Inner tube 31, which may be called a second furnace tube or an inner liner, is a cylindrical member having an open top end and an open bottom end and has hole 27 communicating with vent 6 at the bottom portion. Inner tube 31 is made of silicon carbide material, and its inside face is coated with an SiC coating layer formed by CVD. Inner tube mount 22 supports inner tube 31, being movable in the direction shown by arrow B (vertical direction) by an inner tube elevator (not shown in the drawing) when the inner tube is mounted or demounted. O-ring 24 ensures gastightness between furnace cover 26 and inner tube mount 22. O-ring 25 ensures gastightness between inner tube mount 22 and furnace tube 32. Pipe 28 introduces the gas from inner tube 31 and allows the gas to flow through hole 27 to vent 6.

With this constitution, wafer W is treated for hydrogen annealing at a temperature, for example, of 1000° C. or higher. In the hydrogen annealing, hydrogen gas is introduced through gas inlet 5 and gas introduction pipe 33 into furnace tube 32. A portion of the introduced gas passes through the inside of inner tube 31 and is discharged through pipe 28 and vent 6 to the outside, and the rest of the introduced hydrogen gas passes through the interspace (region 53) between furnace tube 32 and inner tube 31 and is discharged from vent 6.

In this way, inner tube 31 serves to shield the wafer W from the metallic impurity released from fused quartz of the inside wall of furnace tube 32 and from the moisture formed by reaction between fused quartz of inside wall of furnace tube 32 and the hydrogen gas, which produces the effect of preventing the metal contamination of wafer W and the silicon etching thereof.

In this embodiment, even if the inner tube 31 is broken or damaged, leakage of the high-temperature hydrogen gas to the outside is prevented by furnace tube 32 surrounding inner tube 31 to be gastight. Therefore, inner tube 31 may be made of a material less resistant to impact and high temperature like SiC without a problem.

This embodiment has a double tube structure constituted of furnace tube 32 and inner tube 31. Additionally a mantle tube (outer liner) may be provided as a third tube at the outside of furnace tube 32 for intercepting a metallic impurity formed by heater 3 outside furnace tube 32. The mantle tube is preferably made of a material which intercepts effectively the metallic impurity and emits less impurity from the mantle tube itself. An example of the material is silicon carbide having an SiC coating layer formed thereon by CVD.

In the present invention, silicon carbide coated with SiC by CVD is suitably used as the constituting material for inner tube 31 placed at high-temperature range 50 and for gas introduction tube 33. However, the material is not limited thereto. Any non-silicon oxide material is useful which has a high purity and high heat resistance and does not emit metal in ambient gas. The useful non-silicon oxide material (non-SiO) includes ceramics such as boron nitride (BN), silicon nitride (SiN), and alumina ($Al_2O_3$) and silicon. Such a construction material does not emit into the treatment gas an etching substance which etches the surface of the semiconductor material or does not produce an etching substance by reaction with the treatment gas.

The above "substance which etches the surface of the semiconductor material" etches the semiconductor material itself or in combination with the ambient gas by reaction with the semiconductor material. The above-mentioned "construction material" itself does not naturally emit the aforementioned etching substance, and further does not form the etching substance by chemical reaction with the ambient gas. The construction material includes a silicon carbide material coated with an SiC film by CVD, and other materials which have high purity and low chemical activity with the ambient gas, and which does not produce moisture by reaction with the ambient gas.

Inner tube 31 intercepts the wafer W from the etching substance such as moisture formed by reaction of a silica material with hydrogen in furnace tube 32 emits by itself a minimal amount of an etching substance, if any. Therefore, inner tube 31 serves effectively to reduce the undesired etching of silicon.

By use of furnace tube 32 made of vitreous silica of high light transmittance, the infrared light emitted by heater 3 is transmitted effectively to wafer W to heat it.

In FIG. 1, the bodies of inner tube 31 and gas introduction pipe 33 are made of SiC. However, they may be made of another material coated with SiC at least on the inside wall of inner tube 31 in high temperature region 50 and on the inside face of gas introduction pipe 33 in high temperature region 50.

The institution of the closable or evacuatable furnace tube of the present invention is not limited to fused quartz produced by a known process of electric fusion or flame fusion, but may be made of synthetic fused silica produced by a plasma process, a soot process, or a sol-gel process. These vitreous silica, which contain hydroxyl groups at a low content of 300 ppm or lower, have a viscosity coefficient of not less than 1011 at 1200° C. thus being resistant to deformation in high-temperature heat treatment.

The third tube, the mantle tube, employed in the present invention may be either of an open type or a closed type. If necessary, a purge gas is allowed to flow through the space between furnace tube 32 and the mantle tube. The mantle tube is necessarily placed in the high temperature region 50.

Heater 3 in the present invention includes those having heating elements made of a material such as FeCrAl alloys, Ta alloys, ceramics, and carbon or halogen lamps, and if necessary, may be provided with a heat-conductive equalizer plate additionally.

Embodiment 2

Figure 3:
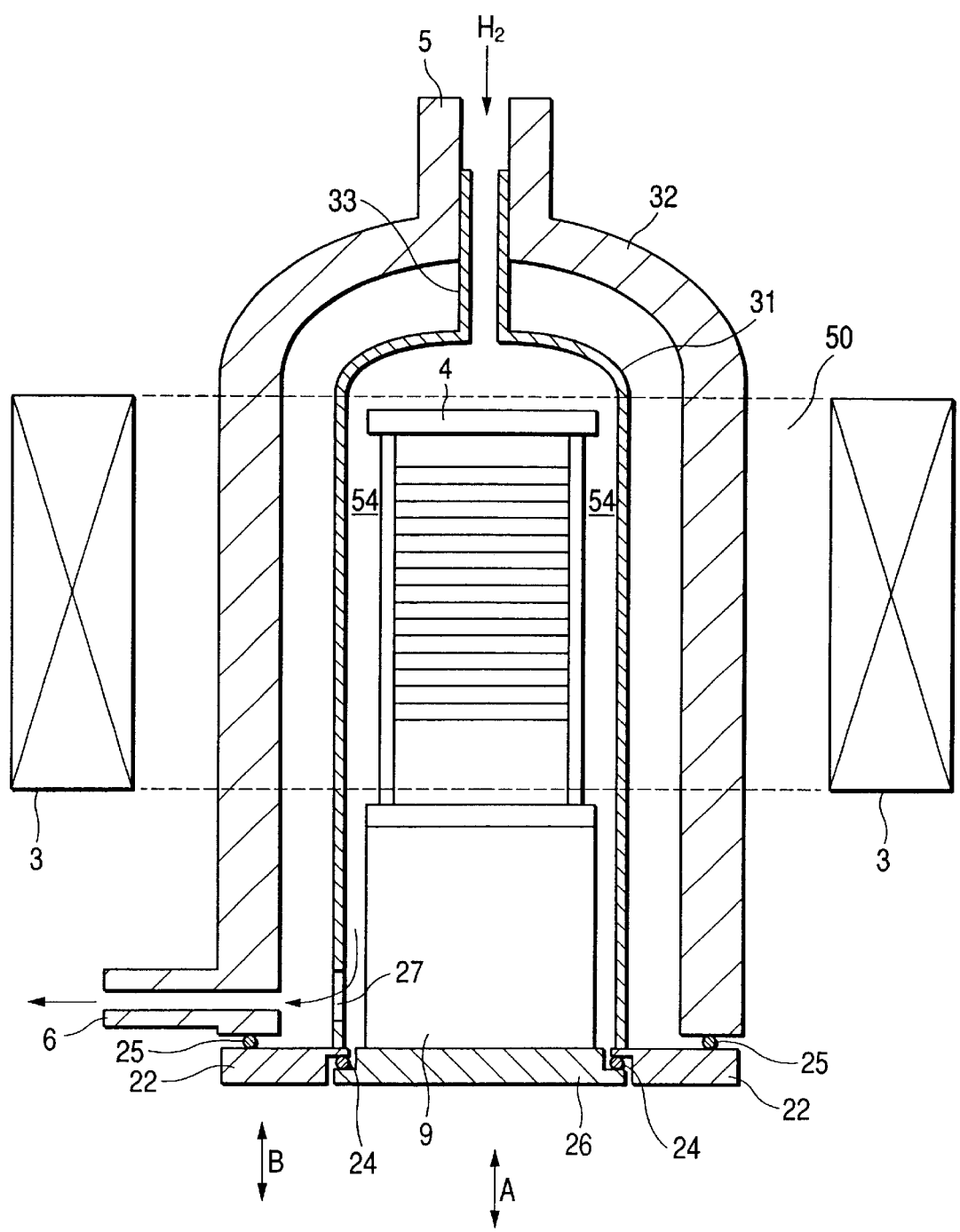
FIG. 3 is a sectional view of the heat treatment apparatus of a second embodiment of the present invention.

Embodiment 2 of the present invention is described by reference to FIG. 3. In this embodiment, furnace tube 32, gas inlet 5 at the top of furnace tube 32, and vent 6 are formed in one body from fused quartz. Second furnace tube (inner tube) 31 is cylindrical and capped, having a hole 27 on the side wall at the lower end portion for gas discharge, and having gas introduction pipe 33 at the top. The inside wall of the second furnace tube is coated with SiC by CVD.

In the hydrogen annealing treatment of wafer W at a high temperature, for example, of 1000° C. or higher, the hydrogen gas as the ambient gas is introduced from gas inlet 5 through gas introduction pipe 33 into inner tube 31 and is discharged from hole 27 through vent 6 to the outside.

In this embodiment, the same effect as in Embodiment 1 is achieved. Further, the space in which wafer W is placed is intercepted from the outside by inner tube 31 except the portions in contact with gas introduction pipe 33, hole 27, and furnace cover 26. However, in Embodiment 1, improper adjustment of the gas flow can cause contact of the hydrogen gas with furnace tube 32 to release metallic impurity and produced moisture into the hydrogen gas flow, whereby the gas containing them enters the inside of inner tube 31 to reach wafer W. On the other hand in this embodiment, such a phenomenon does not occur.

This embodiment has a constitution such that the hydrogen gas is not brought into contact with the vitreous silica in the space of wafer W in high-temperature region 50. Therefore, the hydrogen gas in the space where wafer W is placed does not contain metallic impurity released from the vitreous silica or does not contain moisture.

Incidentally, heat barrier 9 and furnace cover 26 are in contact with hydrogen gas in the space where wafer W is placed. However, the contact portions are outside the high temperature region 50 heated by heater 3, so that metallic impurity is not released or moisture is not produced there. Further, in this embodiment, since the hydrogen gas is introduced from gas introduction pipe 33, the hydrogen gas is not brought into contact with the vitreous silica at the upstream region of the hydrogen gas flow relative to wafer W.

This embodiment is summarized as below.

(1) Closed space structure of inner tube:

The space which encloses wafer W is intercepted from the outside by inner tube 31 except for the gas introduction portion (gas introduction pipe 33), the gas discharging portion (hole 27) and the opening to be closed with furnace cover 26. The wording "space which encloses wafer W" herein means the space occupied by wafer W and its surrounding. The arrangement and the number of the atmospheric gas introduction portions and the atmospheric gas discharging portions are selected suitably without limitation to the description in this embodiment.

Owing to interception of the space enclosing wafer W from the outside, the metallic impurity and moisture released by contact of furnace tube 32 with the hydrogen gas, even if they are released into the hydrogen gas, does not penetrate into the inside of inner tube 31, whereby the contamination by metal and etching of silicon are reduced further.

(2) Prevention of contamination by metal and moisture in closed space:

The atmospheric gas is not brought into contact with furnace tube 32 in high temperature region 54 of the space enclosing wafer W. The wording "high temperature region 54 of the space enclosing wafer W" herein means a region heated by heater 3 to a high temperature, approximately to the heat treatment temperature in region 50. Owing to the construction for preventing the contact of the hydrogen gas with the vitreous silica, the silicon etching is prevented or reduced significantly.

(3) Prevention of contamination by metal and moisture in upstream portion of atmospheric gas:

The hydrogen gas is not brought into contact with furnace tube 32 in the high temperature region in the upstream side from wafer W. The wording "high temperature region in the upstream side from wafer W" herein means a portion of hydrogen gas flow upstream relative to wafer W which is heated to a high temperature by heater 3. This region is not present in the apparatus of FIG. 3. This region is present in the embodiment of FIG. 1, including the portion of gas introduction pipe 33 in region 50. In FIG. 3, gas introduction pipe 33 is not included in the high temperature region since it is not heated by heater 3 and the temperature rise is less even though it is placed at the upstream position.

In this embodiment, the hydrogen gas is not brought into contact with the vitreous silica at the high temperature region in the upstream portion of the gas flow. Thereby, arrival of the released metallic impurity and water formed from the vitreous silica into the hydrogen gas at wafer W is prevented, and the metal contamination and silicon etching caused by the hydrogen gas is prevented or reduced greatly.

Embodiment 3

Figure 4:
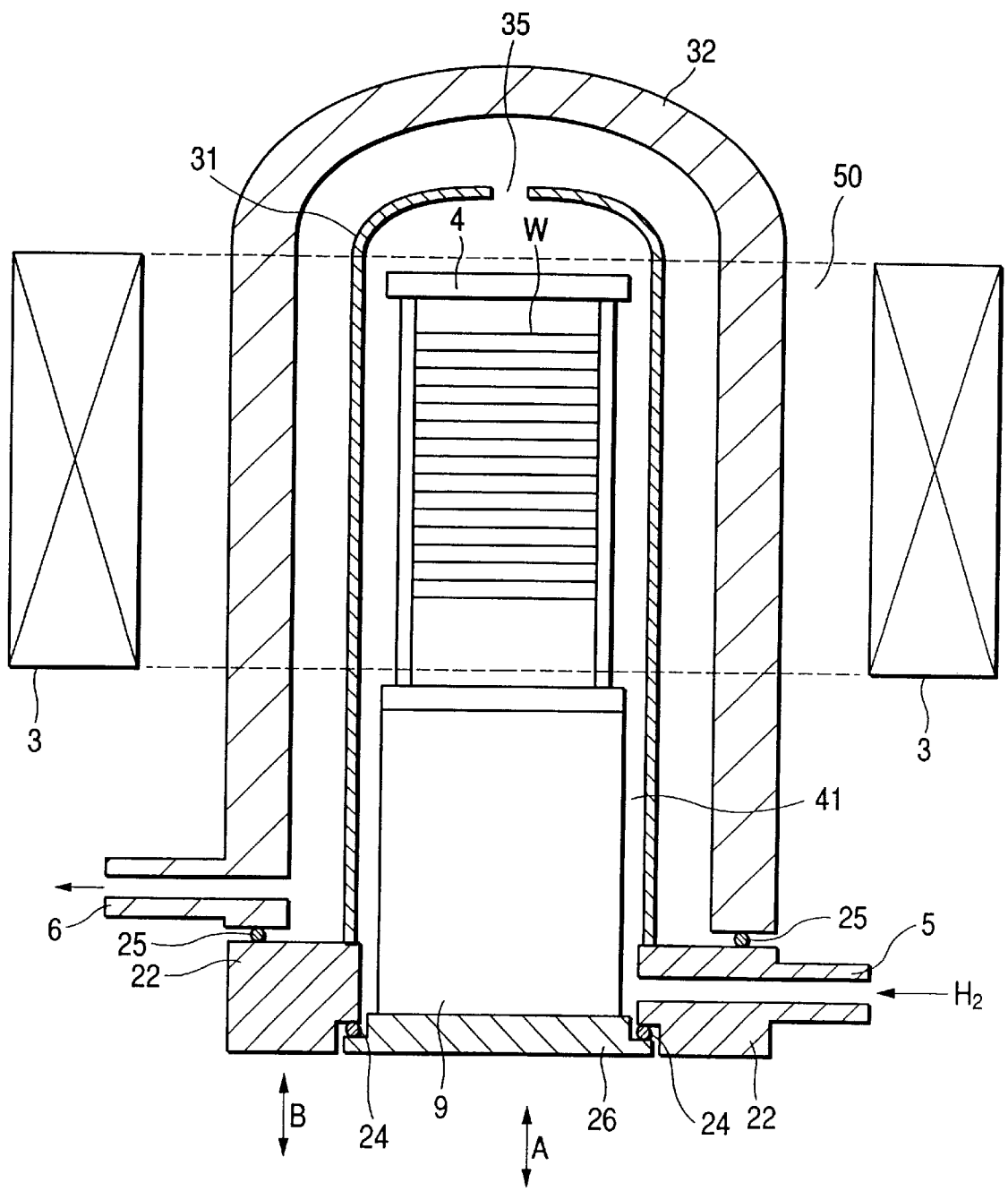
FIG. 4 is a sectional view of the heat treatment apparatus of a third embodiment of the present invention.

A third embodiment of the present invention is described by reference to FIG. 4. In this embodiment, gas inlet 5 is provided at the bottom end portion of inner tube 31 and is formed in one body with inner-tube mount 22. The numeral 35 indicates a hole for a gas vent at the top end of inner tube 31.

In hydrogen annealing wafer W at a temperature, for example, of 1000° C. or higher, the hydrogen gas is introduced from gas inlet 5 at the bottom end of inner tube 31, allowed to flow upward in inner tube 31, and then introduced through hole 35 at the top of inner tube 31 into furnace tube 32. Subsequently, the hydrogen gas is allowed to flow downward through the interspace between furnace tube 32 and inner tube 31 and is discharged from vent 6 at the bottom end of furnace tube 32.

In this embodiment, the same effects are achieved as in Embodiment 2. Further, the arrangement of the hydrogen introduction portion and the hydrogen discharge portion shown in FIG. 4 eliminates stagnation of hydrogen flow, enabling rapid gas substitution.

Further in this embodiment, the hydrogen gas is introduced and discharged as described above. Therefore, gas inlet 5 and gas vent 6 can be placed both at the lower portion of the apparatus, which facilitates connection with external pipings and inspection of the connection.

Heat barrier 9 is constituted of vitreous silica such as foamed quartz. The hydrogen gas is fed through flow path 41 in contact with heat barrier 9 to wafer W. Since the heat barrier is at the outside of high temperature region 50, moisture is not produced there and etching is prevented.

Embodiment 4

Figure 5:
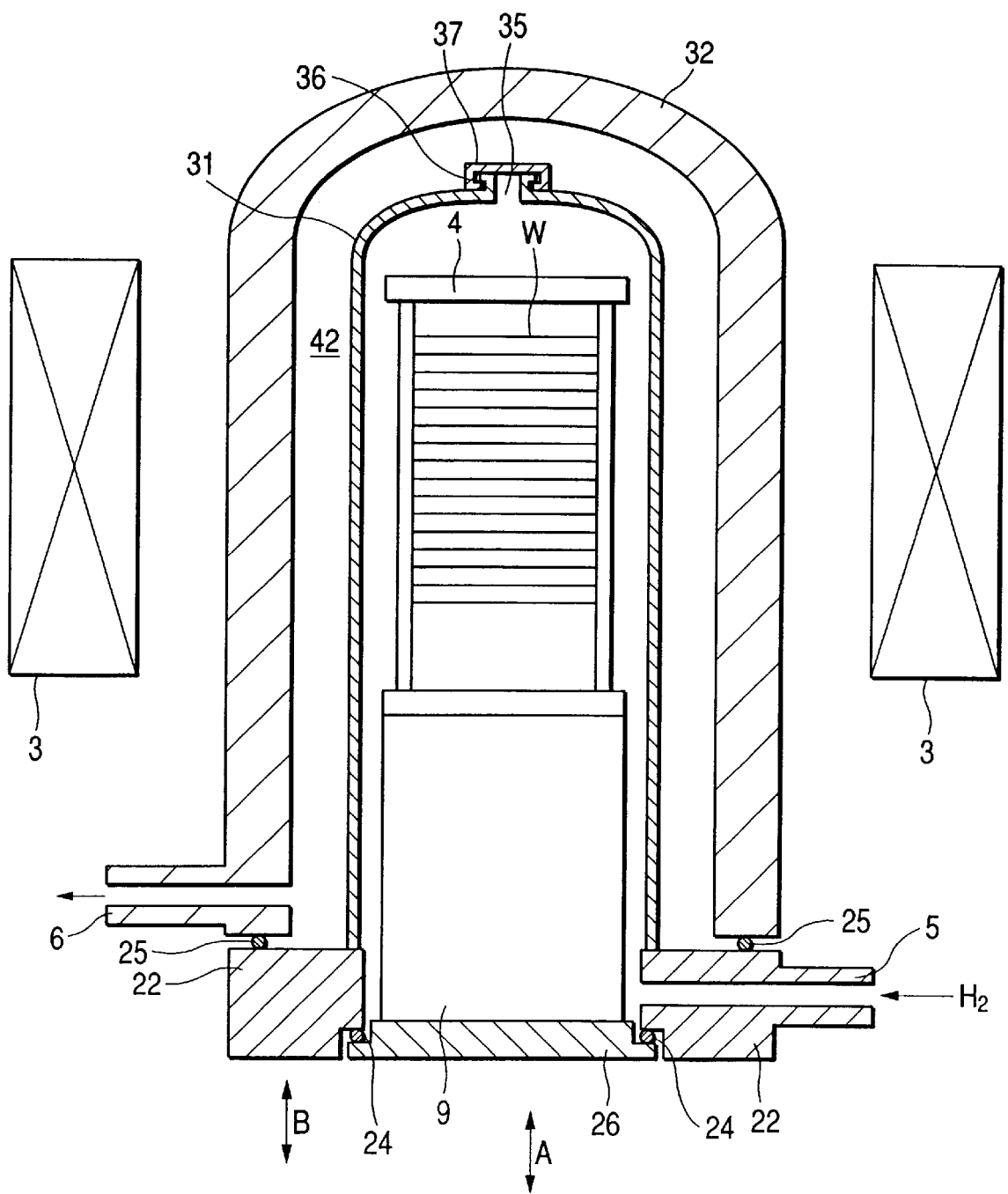
FIG. 5 is a sectional view of the heat treatment apparatus of a fourth embodiment of the present invention.

A fourth embodiment of the present invention is described below by reference to FIG. 5.

At gas outlet hole 35, a check valve is provided which comprises projection 36 formed at the periphery of hole 35 and cap 37 to cover outlet hole 35. Projection 36 is formed from SiC in one body with inner tube 31. Cap 37 is also made of SiC. The gas pressure in inner tube 31 pushes up cap 37 to give a gap at gas outlet hole 35 to allow hydrogen gas to flow from inner tube 31 through this gap to interspace 42 between inner tube 31 and furnace tube 32. The back flow of the gas is stopped by the check valve. Projection 36 keeps cap 37 from coming off of outlet hole 35.

The check valve stops a back flow of the metal impurity which is released from the fused quartz of furnace tube 32 and moisture which is formed by contact of hydrogen gas with the fused quartz of furnace tube 32 into inner tube 31 and prevents or reduces remarkably the metal contamination and the etching of the silicon.

In this embodiment, as described above, a back flow checking means is provided which checks a back flow of hydrogen gas from the space between furnace tube 32 and inner tube 31 into inner tube 31. The back flow checking means may be the above check valve, but is not limited thereto. For example, the means may be a simple orifice in the gas flow path.

Embodiment 5

Figure 6:
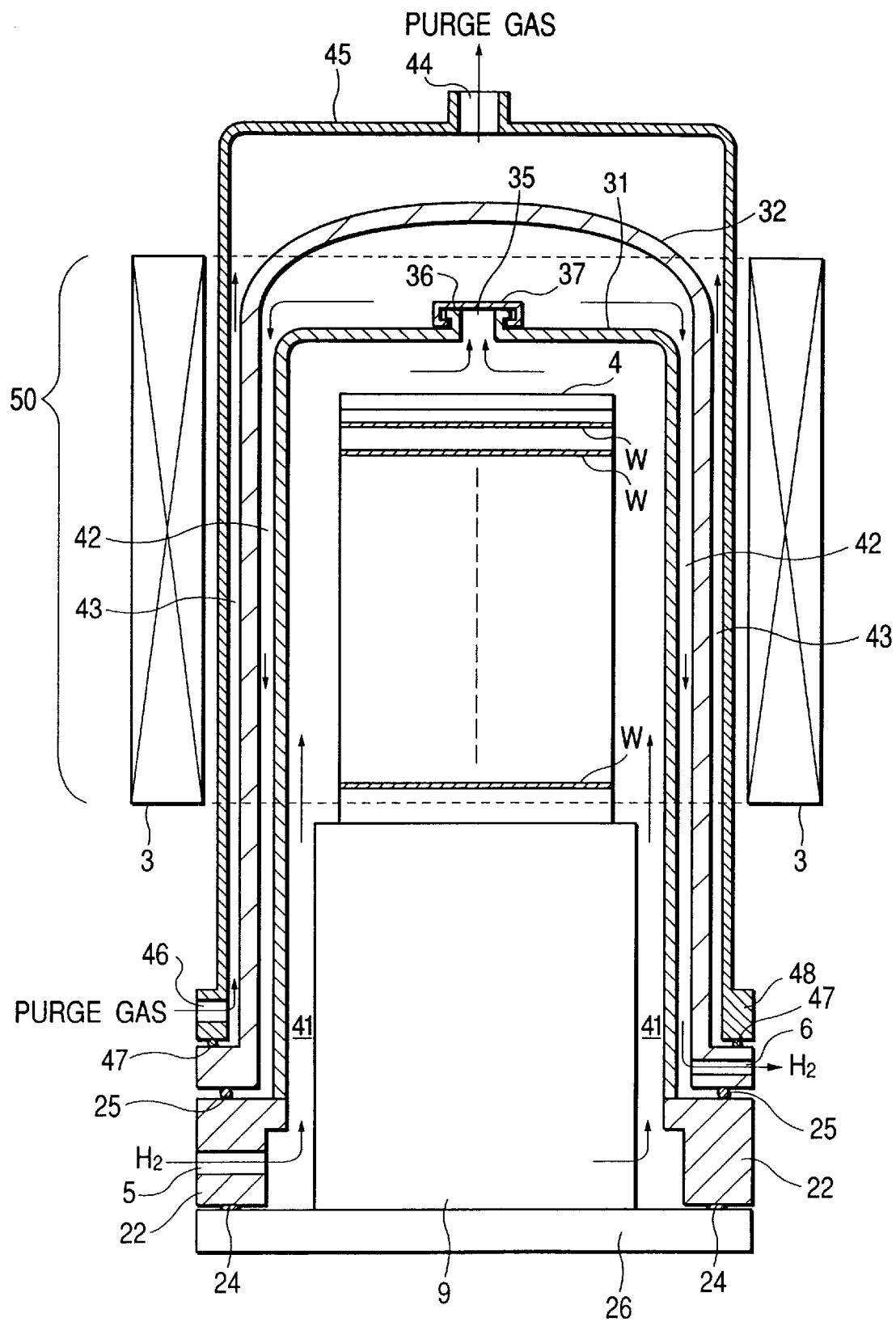
FIG. 6 is a sectional view of the heat treatment apparatus of a fifth embodiment of the present invention.

FIG. 6 shows the heat treatment apparatus of this embodiment of the present invention. This heat treatment apparatus comprises inner tube 31 having an inside face comprised of non-silicon oxide like SiC, furnace tube 32 made of vitreous silica like fused quartz, and mantle tube 45 having a surface comprised of non-silicon oxide like SiC. The numerals 24, 25, and 47 respectively indicate an O-ring, and the numeral 48 indicates a flange.

The hydrogen-containing reducing gas is introduced from gas inlet 5 at the bottom through flow path 41 into the space enclosing wafer W. The gas is further allowed to flow through hole 35 and check valve (36,37) to flow path 42 between furnace tube 32 and inner tube 31 and is discharged from vent 6. Interspace 43 between furnace tube 32 and closed mantle tube 45 is purged with an inert gas such as He, Ar, Ne, $N_2$, Kr, or Xe which is introduced from purge gas inlet 46 at the bottom and is discharged from purge gas vent 44 at the top.

The hydrogen gas is not brought into contact with silicon oxide heated at a temperature of 1000° C. or higher before the gas is introduced into the space which encloses wafer W. Specifically, since heat barrier 9 made of foamed quartz is placed at the outside of high-temperature heating region 50 heated by heater 3, the hydrogen gas flowing through flow path 41 does not cause moisture generation, the moisture in the hydrogen gas therefore being negligible.

The space in inner tube 31 and in high-temperature heating region 50, namely the space enclosing the wafer, is surrounded by an inside face comprised of a non-silicon material like SiC entirely, whereby moisture is not generated. The gas flow is kept uniform in inner tube 31 by discharging the gas from hole 35 at the center of the top of the tube. Furnace tube 32, which is a closed tube made of silicon oxide like fused quartz, exhibits a high heat-insulation effect, uniformizing the temperature in high-temperature heating region 50. Even if hydrogen leaks out of inner tube 31, it will not leak out of furnace tube 32. Boat 4 for holding wafer W also has a surface made of non-silicon oxide like SiC, therefore not producing moisture.

The closed mantle tube 45 and the purge gas prevent penetration of metal impurity from heater 3 into inside tubes.

Heat Treatment

The heat treatment is conducted in Embodiments 1 to 5 of the present invention as described below.

A semiconductor article like an Si wafer is placed in inner tube 32 in the apparatus shown in any of FIG. 1 or FIGS. 3 to 6. A hydrogen-containing gas is introduced into inner tube 32 to keep the semiconductor article in a reducing atmosphere. Before or after the start of the introduction of the hydrogen-containing gas, the semiconductor article is heated up to a prescribed temperature. The heat treatment temperature is preferably not lower than 900° C, but lower than the melting point of silicon, more preferably in the range from 1000 to 1200° C. The heat treatment time depends on the intended annealing effect and is usually selected suitably in the range from 3 minutes to 5 hours. Thus heat treatment of the semiconductor article is completed.

The semiconductor article employed in the present invention includes CZ Si wafer, SOI Si wafer, and wafers having an Si film or Si islands on a vitreous silica. The wafer may be of any state, taken before, in, or after a semiconductor production process. In particular, the present invention is effective in hydrogen annealing an SOI wafer having an unpolished rough surface.

The treatment gas employed in the present invention is 100% hydrogen or a mixture containing 1% to 99% hydrogen and an inert gas.

The pressure of the hydrogen-containing reducing atmosphere may be a higher pressure, an ordinary pressure, or a reduced pressure. Preferably the pressure ranges from $1.02 \times 10^5$ Pa to 1.33 Pa, more preferably from $1.02 \times 10^5$ Pa to $1.33 \times 10^3$ Pa.

Process for Producing Semiconductor Article

A process is described below for producing a semiconductor article by a heat treatment method of the present invention.

Figure 7:
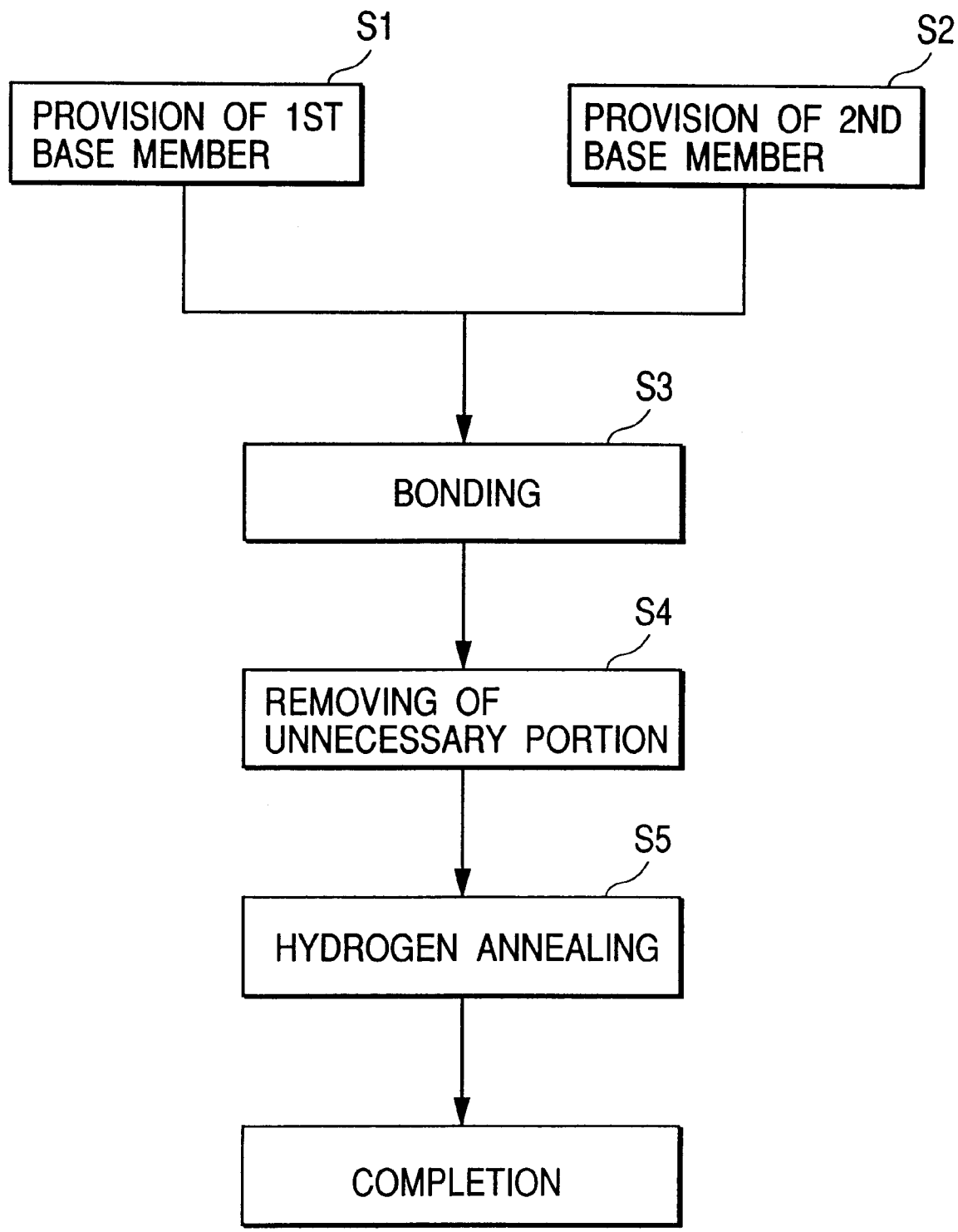
FIG. 7 is a flow chart of the process of producing a semiconductor article according to the present invention.

FIG. 7 is a flow chart of the production of a bonding SOI substrate typified by a hydrogen injection peeling method, a PACE method, and an epitaxial layer transfer method.

In Step S1, a first base member is provided. An example of the first base member is provided by injecting hydrogen ions or rare earth gas ions into an Si wafer having an insulation layer formed by oxidation at least on one face to form a separation layer (latent layer) at a prescribed depth. Another example thereof is prepared by making porous a surface of an Si wafer and growing epitaxially thereon a nonporous Si layer. a PACE method, the first base member is an Si wafer having no oxide film or having an oxidized surface.

In Step S2, a second base member is provided. Examples of the second base member include usual Si wafers, Si wafers having an oxidized surface, Si wafers having a natural oxide film eliminated, quartz wafers, and metal base plates.

In Step S3, the first base member and the second base member provided above are bonded directly or indirectly with interposition of an adhesive layer. In this step, at least one of the bonding faces of the first base member and the second base member should have an insulation layer. In the production of a base member having a structure other than SOI, the insulation layer is not always necessary. The bonding face may be activated by irradiation with ions of hydrogen, oxygen, nitrogen, or a rare earth gas.

In Step S4, a part (unnecessary portion) of the first base member is removed from the assembly of the bonded first and second base members. The methods of the removal are classified roughly into two. In a first method, a part of the first base member is removed from the back face thereof by grinding, etching, or a like technique. In a second method, the surface portion and the inner portion of the first base member are separated at the separation layer formed preliminarily in the first base member. By the second method, the separated unnecessary portion keeps the shape of the wafer, so that it can be reused as the first base member or the second base member. The separation can be conducted by exfoliation by heat treatment, by blowing a fluid comprised of a liquid or a gas against the lateral side of the assembly, or by mechanical peeling.

The assembly (SOI substrate) having the unnecessary portion removed has a rough surface with voids formed by ion injection, pores of the porous layer, or projections and cavities caused by grinding or etching. Therefore, in Step S5, the rough upper layer of the silicon layer is smoothed by conducting hydrogen annealing with the above-described heat treatment apparatus. Thereby, the etched silicon layer surface is smoothed to a surface roughness of not more than 0.2 nm (1 µm square). By optimizing the smoothing conditions, the roughness can be reduced to be not more than 0.15 nm, or further not more than 0.1 nm.

Next, a process is described below in detail for producing a semiconductor substrate according to an epitaxial layer transfer method by reference to FIGS. 8A to 8F.

In Step S31 of FIG. 8A, base plate 131 comprised of Si single crystal is provided as the first base member, and thereon a porous structure layer 133 is formed at least at the main surface side. The porous Si can be formed by anodization of an Si base plate in an HF solution. The porous layer has a structure like a sponge in which pores of about $10^{-1}$ nm to about 10 nm in diameter are formed at intervals of about $10^{-1}$ nm to about 10 nm. The density can be controlled in the range from 2.1 to 0.6 g/cm$^3$, in comparison with the density 2.33 g/cm$^3$ of single crystal Si, by changing the concentration of the HF solution in the range of 50% to 20%, changing the alcohol addition ratio, or changing the electric current density. The porosity of the porous portion can be changed by adjusting preliminarily the resistivity and the electric conduction type. In the p-type, a non-degenerated base plate (P$^-$) forms pores of smaller diameter and a pore density higher by one digit in comparison with a degenerated base plate (P$^+$) under the same anodization conditions. Thus, the porosity can be controlled by controlling the pore forming conditions without limiting the control method. Porous layer 133 may be a single layer or a lamination of layers of different porosities. The porosity can be raised by ion implantation to reach the porous layer, whereby bubbles are formed on the pore walls of the porous layer near the implantation. The ion implantation may be conducted before or after the formation of the porous layer by anodization or after formation of a single crystal semiconductor layer structure on porous layer 133.

In the following Step S32 of FIG. 8B, at least one nonporous single crystal semiconductor layer 123 is formed on porous layer 133. Nonporous single crystal semiconductor layer 123 may be selected suitably from epitaxially grown single crystal Si layers, layers formed by making the surface layer of porous layer 133 nonporous, or the like. On the single crystal Si layer 123, silicon oxide layer 122 is formed by thermal oxidation. Thereby, the interface level between the single crystal silicon layer and the embedded oxide layer is made lower.

In Step S33 of FIG. 8C, the main face (bonding face) of the above semiconductor base plate having nonporous single crystal Si layer 123 is brought into close contact with a surface (bonding face) of second base plate 121. Before the contact, adhering and foreign matters are preferably removed by washing. The second base plate may be selected from Si plates having an Si oxide film thereon, light-transmissive plates like quartz plates, sapphire plates, and the like, but is not limited thereto. Any material having a flat and smooth bonding surface may be used as the second base plate. In FIG. 8C, the first base plate and the second base plate are bonded with interposition of insulation layer 122. However, insulation layer 122 is not essential. In the bonding, an insulating thin plate may be placed between the first base plate and the second base plate.

In the next step, the unnecessary back face portion of the first base plate 131 and porous layer 133 are removed to bare nonporous single crystal Si layer 123. This removal can be conducted in two alternative methods, but is not limited thereto.

In a first method, first base plate 131 is removed from the back side to bare porous layer 133 (Step S34 of FIG. 8D). Then, porous layer 133 is removed to bare nonporous silicon layer 123 (Step S35 of FIG. 8E). The removal of the porous layer is preferably conducted by selective etching. By use of an etching solution containing hydrofluoric acid at least and aqueous hydrogen peroxide, the porous silicon can be etched selectively relative to nonporous single crystal silicon by a selectivity factor of $10^5$. A surfactant may be added to the etching solution to prevent bubble adhering. An alcohol such as ethanol is added thereto suitably. If the porous layer is thin, the selective etching may be omitted.

In a second method, the base plates are separated at porous layer 133 as the separation layer to obtain the state of the base plate as shown in Step S34 of FIG. 8D. The method of the separation includes application of external mechanical force such as pressing, pulling, shearing, and wedging, application of ultrasonic wave, heating, oxidation to swell the porous Si from the periphery to apply internal pressure to inside porous Si, application of heat pulse to cause thermal stress or softening, and ejection of a fluid such as a water jet or gas jet, but is not limited thereto.

In next Step S35, the remaining portion of porous layer 133 is removed from the surface of second base plate 121 by etching in a manner similar to the etching of the porous layer. If the remaining portion of porous silicon 133 on second base plate 121 is very thin and uniform in thickness, the wet etching of the porous layer with hydrofluoric acid and hydrogen peroxide may be omitted.

In Step S36 of FIG. 8F, single crystal Si layer 123 is heat treated to smooth the rough surface by heat treatment in a hydrogen-containing reducing atmosphere by means of any of the apparatuses shown in FIG. 1 or FIGS. 3 to 6.

The semiconductor base plate prepared according to the present invention has single crystal Si film 123 formed in a flat uniform thin film on second base plate 121 with interposition of insulation layer 122 in a large area over the entire base plate. Such a semiconductor base plate is suitable for preparing insulated electronic elements.

Separated first single crystal Si base plate 131 can be reused, after removal of the remaining porous layer on the base plate separation face and, if the surface is intolerably rough, subsequent surface smoothing, as first single crystal base plate 131 or second base plate 121.

EXAMPLE 1

A silicon wafer 5 inches in diameter was treated by hydrogen annealing at 1100° C. for 4 hours with a hydrogen gas flow rate of 10 L/min. The hydrogen treatment was conducted, for comparison, by use of the apparatus shown in FIG. 2, and by use of the apparatus shown in FIG. 1 to confirm the effect of the reduction of metal contamination of the present invention. Inner tube 31 was made of a silicon carbide material having a SiC coating layer formed by CVD. The metal contamination by the respective apparatuses was compared by measurement of the carrier lifetime of the wafers after heat treatment. Table 1 shows the results. In the heat treatment according to the present invention, the carrier life was improved by a factor of about 2 in comparison with the conventional heat treatment as shown in Table 1, which shows the effects of reducing the metal contamination of the wafer in hydrogen annealing.

TABLE 1

|  | Heat treatment apparatus | |
| --- | --- | --- |
|  | FIG. 1 | FIG. 2 |
| Carrier lifetime ($\mu$sec) | 15 | 28 |

EXAMPLE 2

A surface of an 8-inch boron-doped (100) Si wafer having a resistivity of 0.017 Ωcm was anodized in a 2:1 mixture of 49% HF and ethyl alcohol to form a porous silicon layer in a thickness of 10 $\mu$m on the surface of the wafer. This silicon wafer was heat treated in an oxygen atmosphere at 400°C. for one hour to form a thin oxide film on the surface of the pores. Then, from the external face of the porous layer and vicinity thereof, the formed oxide film was removed by immersion in an aqueous 1.25% HF solution for 30 seconds. The wafer was washed sufficiently with water and dried. This silicon wafer was heat treated in an epitaxial growth apparatus with the introduction of a trace amount of a silane gas in a hydrogen atmosphere at 1100° C. to close nearly all of the holes on the external face of the porous silicon. Subsequently, a single crystal Si film was formed in an average thickness of 310 nm ±5 nm on the porous silicon by the addition of dichlorosilane or silane to the hydrogen gas. This silicon wafer was transferred from the epitaxial growth apparatus to an furnace, and the surface of the single crystal Si film was oxidized by hydrogen-oxygen combustion gas to form a silicon oxide film in a thickness of 200 nm. As the result of the oxidation, the thickness of the single crystal silicon film decreased to 210 nm. This silicon wafer and a separately provided second silicon wafer were washed by a conventional wet washing process for silicon devices to clean the surfaces, and the two wafers were bonded together. The resulting silicon wafer assembly was heat treated in an oxygen-containing atmosphere at 1100° C. for one hour to strengthen the bonding of the wafers. In this heat treatment, the temperature was elevated in a mixed atmosphere of nitrogen and oxygen, kept at 1100° C. in oxygen atmosphere for one hour, and lowered in a nitrogen atmosphere. The non-bonded face of the first wafer was ground to bare the porous silicon. Then the porous silicon was removed by etching by immersion in a mixed solution of hydrofluoric acid and aqueous hydrogen peroxide. After washing, the wafer was washed sufficiently by wet washing. Consequently, the single crystal silicon film was transferred together with the silicon oxide onto the second silicon wafer to produce an SOI wafer.

The thickness of the transferred single crystal silicon was measured at 10 mm lattice points in the plane. The average thickness was 210 nm with a variation of ±7 nm. The surface roughness was measured with atomic force microscopy in the range of 1 $\mu$m square and 50 $\mu$m square at 256×256 points. The surface roughness was 10.1 nm and 9.8 nm, respectively, in terms of average square roughness Rrms. The boron concentration in the single crystal silicon film was $1.2 \times 10^{18}/cm^3$ according to secondary ion mass spectroscopy (SIMS).

The plural SOI wafers produced as described above, after removal of the silicon oxide films from the back faces by hydrofluoric acid etching, were placed in a heat treatment apparatus as shown in FIG. 1. The wafers were set horizontally with intervals of 6 mm between the silicon of the back face of one SOI wafer and the surface SOI layer of the adjacent SOI wafer with the centers of the wafers positioned on the center line of the furnace tube on a boat made of SiC. Above the uppermost SOI wafer, a commercial silicon wafer was set at the same interval. The atmosphere in the furnace was substituted with hydrogen. The temperature in the furnace was elevated to 1100° C. kept for 4 hours, and then lowered. The thickness of the SOI layers measured again.

For comparison, the SOI wafers prepared in the same manner were hydrogen annealed with an apparatus as shown in FIG. 2.

As shown in Table 2, the maximum etching amount is less in the present invention by a factor of ⅛ than the conventional method, and correspondingly the variation of the etching is greatly decreased. Obviously, the present invention provides an SOI base plate with decreased etching and uniform thickness.

TABLE 2

|  | Heat treatment apparatus | |
| --- | --- | --- |
|  | FIG. 2 | FIG. 1 |
| Maximum etching (nm) | 8 | 1 |
| Minimum etching (nm) | 1 | 0 |

As described above, the present invention provides a heat treatment apparatus which does not cause metal contamination of a wafer by silicon oxide of a furnace tube as the contamination source and does not cause etching of a silicon wafer body by moisture formed with the reaction of silicon oxide and the hydrogen gas. The present invention also provides a process of heat treatment employing the above heat treatment apparatus. Semiconductor articles having excellent properties can be produced according to the process of the present invention.

What is claimed is:

1. A heat treatment apparatus comprising:
a first tube,
a second tube placed therein,
a heater, and
a third tube provided between the first tube and the heater,
wherein the first tube is tightly closable and is made of vitreous silica having an impact strength higher than that of the second tube,
wherein the second tube has at least an internal face comprised of non-silicon oxide,
wherein a gas flow path is constructed to introduce a gas into a treatment space in the second tube without passing over a face comprised of silicon oxide heated to a high temperature by the heater, and
wherein a purge gas is introduced into an interspace between the third tube and the first tube.

2. The heat treatment apparatus according to claim 1, wherein the vitreous silica is fused silica, and the non-silicon oxide is silicon carbide.

3. The heat treatment apparatus according to claim 1, wherein the non-silicon oxide is selected from the group consisting of silicon, silicon carbide, silicon nitride, aluminum oxide, and boron nitride.

4. The heat treatment apparatus according to claim 1, wherein the second tube has a surface coated with a silicon carbide film.

5. The heat treatment apparatus according to claim 1, wherein the face comprised of silicon oxide is heated at a temperature of 900° C. or higher.

6. The heat treatment apparatus according to claim 1, wherein the face comprised of silicon oxide is heated at a temperature of 1000° C. or higher.

7. The heat treatment apparatus according to claim 1, wherein the gas is hydrogen gas and is introduced together with or without an inert gas into the second tube.

8. The heat treatment apparatus according to claim 1, wherein the second tube is extended to an upstream side of treatment space.

9. The heat treatment apparatus according to claim 1, wherein the gas is hydrogen gas, and an inlet for the hydrogen gas into the second tube is provided outside the treatment space, and a vent for hydrogen gas from the second tube is provided outside the treatment space and reverse to the inlet.

10. The heat treatment apparatus according to claim 9, wherein the gas outlet is open to the inside of the first tube, and a vent is provided on the first tube to flow the hydrogen gas through the inside space for discharging the hydrogen gas.

11. The heat treatment apparatus according to claim 9, wherein a flow preventing means is provided at the discharge portion to prevent a flow of the gas from the first tube to the second tube.

12. The heat treatment apparatus according to claim 1, wherein the third tube is tightly closable.

13. The heat treatment apparatus according to claim 1, wherein the surface at least of the third tube is comprised of non-silicon oxide.

14. The heat treatment apparatus according to claim 1, wherein the third tube is made of silicon carbide.

15. The heat treatment apparatus according to claim 1, wherein the second tube and the third tube are both closable tightly.

16. The heat treatment apparatus according to claim 1, wherein a support having a non-silicon oxide surface and a heat barrier having a silicon oxide surface are placed in the second tube.

17. The heat treatment apparatus according to claim 1, wherein the heater is provided above a heat barrier placed in the second tube.

18. The heat treatment apparatus according to claim 1, wherein the gas is hydrogen gas, and the hydrogen gas is introduced from a lower portion of the second tube, and is discharged from a lower portion of the first tube.

19. The heat treatment apparatus according to claim 1, wherein a purge gas is introduced from the outside through the bottom of the first tube, and is discharged from the outside through the top of the first tube.

20. A heat treatment apparatus comprising:
a first tube,
a second tube placed therein,
a heater,
a gas inlet for introducing the gas to the second tube provided below the heater,
a vent provided at a bottom portion of the first tube for discharging the gas from inside of the first tube,
a closable third tube having a non-silicon oxide surface provided outside the first tube,
a purge gas inlet provided at a bottom portion of the third tube, and
a purge gas vent provided at a top portion of the third tube,
wherein a hole for communicating the second tube to the first tube is provided at a top portion of the second tube,
wherein the first tube is constructed from fused quartz and is closable,
wherein the second tube has a non-silicon oxide surface and is closable, and
wherein the heater is provided at a higher level than a heat barrier placed in the second tube.

21. The heat treatment apparatus according to claim 20, wherein the heat barrier comprises foamed quartz.

22. A heat treatment process for heat-treating a semiconductor article by means of the heat treatment apparatus set forth in claim 1.

23. The heat treatment process according to claim 22, wherein the semiconductor article has a silicon body.

24. The heat treatment process according to claim 22, wherein the semiconductor article is heat-treated in a hydrogen containing reducing atmosphere at a temperature not lower than 900° C.

25. The heat treatment process according to claim 24, wherein the semiconductor article is heat-treated at a temperature not lower than 1000° C.

26. A heat treatment process for heat-treating a semiconductor article by means of a heat treatment apparatus which comprises:
a first tube,
a second tube placed therein, and
a heater,
wherein the first tube is tightly closable and is made of vitreous silica having an impact strength higher than that of the second tube,
wherein the second tube has at least an internal face comprised of non-silicon oxide, wherein a gas flow path is constructed to introduce a gas into a treatment space in the second tube without passing over a face comprised of silicon oxide heated to a high temperature by the heater, wherein the semiconductor article has a silicon body, and wherein the semiconductor article is an SOI substrate.

27. The heat treatment process according to claim 26, wherein the semiconductor article is a bonding SOI substrate.

28. A heat treatment process for heat-treating a semiconductor article by means of the heat treatment apparatus set forth in claim 20.

29. The heat treatment process according to claim 28, wherein the semiconductor article has a silicon body.

30. The heat treatment process according to claim 28, wherein the semiconductor article is heat-treated in a hydrogen containing reducing atmosphere at a temperature not lower than 900° C.

31. The heat treatment process according to claim 30, wherein the semiconductor article is heat-treated at a temperature not lower than 1000° C.

32. A heat treatment process for heat-treating a semiconductor article by means of the heat treatment apparatus which comprises:

a first tube, a second tube placed therein, a heater, a gas inlet for introducing the gas to the second tube provided below the heater, and a vent provided at a bottom portion of the first tube for discharging the was from inside of the first tube, wherein a hole for communicating the second tube to the first tube is provided at a top portion of the second tube, wherein the first tube is constructed from fused quartz and is closable, wherein the second tube has a non-silicon oxide surface and is closable, wherein the heater is provided at a higher level than a heat barrier placed in the second tube, wherein the semiconductor article has a silicon body, and wherein the semiconductor article is an SOI substrate.

33. The heat treatment process according to claim 32, wherein the semiconductor article is a bonding SOI substrate.

34. A process for producing a semiconductor article comprising the steps of:

bonding a first base plate and a second base plate, removing an unnecessary portion of the first base plate from the second base plate, and heat-treating a silicon body on the second base plate in a hydrogen-containing reducing atmosphere by means of the heat treatment apparatus according to claim 1.

35. The process according to claim 34, wherein a separation layer is formed in the first base plate, and the unnecessary portion is removed by separation at the separation layer.

36. The process according to claim 34, wherein the unnecessary portion of the first base plate is removed by a method selected from the group consisting of polishing, grinding, and etching.

37. The process according to claim 34, wherein the silicon body is an epitaxial layer.

38. The process according to claim 34, wherein the process comprises forming a porous layer on a main face of the first base plate, the first base plate being a silicon single crystal base plate, forming a single crystal silicon layer on the porous layer, bonding the main face of the silicon single crystal base plate to the surface of the second base plate, and removing the porous layer to expose the single crystal silicon layer.

39. A process for producing a semiconductor article comprising the steps of:

bonding a first base plate and a second base plate, removing an unnecessary portion of the first base plate from the second base plate, and heat-treating a silicon body on the second base plate in a hydrogen-containing reducing atmosphere by means of the heat treatment apparatus according to claim 22.

40. The process according to claim 39, wherein a separation layer is formed in the first base plate, and the unnecessary portion is removed by separation at the separation layer.

41. The process according to claim 39, wherein the unnecessary portion of the first base plate is removed by a method selected from the group consisting of polishing, grinding, and etching.

42. The process according to claim 39, wherein the silicon body is an epitaxial layer.

43. The process according to claim 39, wherein the process comprises forming a porous layer on a main face of the first base plate, the first base plate being a silicon single crystal base plate, forming a single crystal silicon layer on the porous layer, bonding the main face of the silicon single crystal base plate to the surface of the second base plate, and removing the porous layer to expose the single crystal silicon layer.

44. A heat treatment apparatus for heating a semiconductor article to 1000° C. or more in a hydrogen-containing reducing atmosphere comprising:

a first tube, a second tube placed therein, and a heater, wherein the first tube is tightly closable and is made of vitreous silica having an impact strength higher than that of the second tube, wherein the second tube has at least an internal face comprised of silicon carbide, and wherein a gas flow path is constructed to introduce a hydrogen gas into a treatment space in the second tube without passing over a face comprised of silicon oxide heated to 1000° C. or more by the heater.

45. The heat treatment apparatus according to claim 44, wherein the vitreous silica is fused quartz.

46. The heat treatment apparatus according to claim 44, wherein the non-silicon oxide is selected from the group consisting of silicon, silicon carbide, silicon nitride, aluminum oxide, and boron nitride.

47. The heat treatment apparatus according to claim 44, wherein the second tube has a surface coated with a silicon carbide film.

48. The heat treatment apparatus according to claim 44, wherein the hydrogen gas is introduced together with an inert gas into the second tube.

49. The heat treatment apparatus according to claim 44, wherein the second tube is extended to an upstream side of treatment space.

50. The heat treatment apparatus according to claim 44, wherein an inlet for the hydrogen gas to the second tube is provided outside the treatment space, and a vent for hydrogen gas from the second tube is provided outside the treatment space and reverse to the inlet.

51. The heat treatment apparatus according to claim 50, wherein the gas outlet is open to the inside of the first tube, and a vent is provided on the first tube to flow the hydrogen gas through the inside space for discharging the hydrogen gas.

52. The heat treatment apparatus according to claim 50, wherein a flow preventing means is provided at the discharge portion to prevent a flow of the gas from the first tube to the second tube.

53. The heat treatment apparatus according to claim 44, wherein a third tube is provided between the first tube and the heater.

54. The heat treatment apparatus according to claim 53, wherein the third tube is tightly closable.

55. The heat treatment apparatus according to claim 53, wherein the surface at least of the third tube is comprised of non-silicon oxide.

56. The heat treatment apparatus according to claim 53, wherein the third tube is made of silicon carbide.

57. The heat treatment apparatus according to claim 53, wherein a purge gas is introduced into an interspace between the third tube and the first tube.

58. The heat treatment apparatus according to claim 53, wherein the second tube and the third tube are both closable tightly.

59. The heat treatment apparatus according to claim 44, wherein a support having a non-silicon oxide surface and a heat barrier having a silicon oxide surface are placed in the second tube.

60. The heat treatment apparatus according to claim 44, wherein the heater is provided above a heat barrier placed in the second tube.

61. The heat treatment apparatus according to claim 44, wherein the hydrogen gas is introduced from a lower portion of the second tube, and is discharged from a lower portion of the first tube.

62. The heat treatment apparatus according to claim 44, wherein a purge gas in introduced from the outside through the bottom of the first tube, and is discharged from the outside through the top of the first tube.

63. A heat treatment apparatus for heating a semiconductor article to 1000° C. or more in a hydrogen-containing reducing atmosphere comprising:

a first tube, a second tube placed therein, a heater, a gas inlet for introducing the hydrogen gas in the second tube provided below the heater, and a vent provided at a bottom portion of the first tube for discharging the gas from inside of the first tube, wherein a hole for communicating the second tube to the first tube is provided at a top portion of the second tube, wherein the first tube is constructed from fused quartz and is closable, wherein the second tube has a non-silicon oxide inner surface and is closable, wherein the heater is provided at a higher level than a heat barrier having a silicon oxide surface placed in the second tube so as not to heat the heat barrier to 1000° C. or more at a top portion of the second tube, wherein the first tube is constructed from fused quartz and is closable, wherein the second tube has a non-silicon oxide inner surface and is closable, wherein the heater is provided at a higher level than a heat barrier having a silicon oxide surface placed in the second tube so as not to heat the heat barrier to 1000° C. or more, and wherein the semiconductor article is an SOI substrate.

64. The heat treatment apparatus according to claim 63, wherein a closable third tube having a non-silicon oxide surface is provided outside the first tube, a purge gas inlet is provided at a bottom portion of the third tube, and a purge gas vent is provided at a top portion of the third tube.

65. The heat treatment apparatus according to claim 63, wherein the heat barrier comprises foamed quartz.

66. A heat treatment process for heat-treating a semiconductor article by means of the heat treatment apparatus set forth in claim 44.

67. The heat treatment process according to claim 66, wherein the semiconductor article has a silicon body.

68. The heat treatment process according to claim 67, wherein the semiconductor article is an SOI substrate.

69. The heat treatment process according to claim 68, wherein the semiconductor article is a bonding SOI substrate.

70. A heat treatment process for heat-treating a semiconductor article by means of the heat treatment apparatus set forth in claim 63.

71. The heat treatment process according to claim 70, wherein the semiconductor article has a silicon body.

72. The heat treatment process according to claim 71, wherein the semiconductor article is an SOI substrate.

73. The heat treatment process according to claim 72, wherein the semiconductor article is a bonding SOI substrate.

* * * * *

UNITED STATES PATENT AND TRADEMARK OFFICE
CERTIFICATE OF CORRECTION

PATENT NO. : 6,407,367 B1
DATED : June 18, 2002
INVENTOR(S) : Masataka Ito et al.

It is certified that error appears in the above-identified patent and that said Letters Patent is hereby corrected as shown below:

Column 2,
Line 50, "at" should read -- at a --.

Column 7,
Line 8, "32" should read -- 32 and --;
Line 21, "institution" should read -- constitution --; and
Line 28, "1011" should read -- $10^{11}$ --.

Column 14,
Line 1, "an" should read -- an oxidation --.

Column 17,
Line 31, "was" should read -- gas --.

Signed and Sealed this

Twenty-fifth Day of February, 2003

JAMES E. ROGAN
*Director of the United States Patent and Trademark Office*